(12) United States Patent
Yoo et al.

(10) Patent No.: US 10,903,177 B2
(45) Date of Patent: Jan. 26, 2021

(54) METHOD OF MANUFACTURING A SEMICONDUCTOR PACKAGE

(71) Applicant: SAMSUNG ELECTRONICS CO., LTD., Suwon-si (KR)

(72) Inventors: Se-Jin Yoo, Asan-si (KR); Hong-Sub Joo, Hwaseong-si (KR); Won-Gil Han, Cheongju-si (KR)

(73) Assignee: SAMSUNG ELECTRONICS CO.. LTD., Suwon-si (KR)

( * ) Notice: Subject to any disclaimer, the term of this patent is extended or adjusted under 35 U.S.C. 154(b) by 0 days.

(21) Appl. No.: 16/511,825

(22) Filed: Jul. 15, 2019

(65) Prior Publication Data

US 2020/0194389 A1    Jun. 18, 2020

(30) Foreign Application Priority Data

Dec. 14, 2018 (KR) .......................... 10-2018-0162037

(51) Int. Cl.
*H01L 21/00* (2006.01)
*H01L 25/00* (2006.01)
(Continued)

(52) U.S. Cl.
CPC ............ *H01L 23/60* (2013.01); *H01L 21/565* (2013.01); *H01L 23/3128* (2013.01);
(Continued)

(58) Field of Classification Search
CPC . H01L 21/565; H01L 21/561; H01L 21/6838; H01L 21/56; H01L 21/78; H01L 23/60; H01L 23/3128; H01L 23/62; H01L 23/50; H01L 23/5286; H01L 23/66; H01L 24/48; H01L 24/73; H01L 24/83; H01L 24/85; H01L 24/92; H01L 24/33; H01L 2224/32145; H01L 2224/32225;
(Continued)

(56) References Cited

U.S. PATENT DOCUMENTS 7,576,414 B2 * 8/2009 Huang ................... H01L 23/60
257/630
7,960,823 B2 * 6/2011 Uchino .................. H01L 23/50
257/691
(Continued)

FOREIGN PATENT DOCUMENTS

JP   2002-198466 A    7/2002
JP     4000633 B2    10/2007
(Continued)

*Primary Examiner* — Nikolay K Yushin
(74) *Attorney, Agent, or Firm* — Sughrue Mion, PLLC

(57) ABSTRACT

In a method of manufacturing a semiconductor package, a first semiconductor device is arranged on a package substrate. An electrostatic discharge structure is formed on at least one ground substrate pad exposed from an upper surface of the package substrate. A plurality of second semiconductor devices is stacked on the package substrate and spaced apart from the first semiconductor device, the electrostatic discharge structure being interposed between the first semiconductor device and the plurality of second semiconductor devices. A molding member is formed on the package substrate to cover the first semiconductor device and the plurality of second semiconductor devices.

20 Claims, 22 Drawing Sheets

(51) Int. Cl.
*H01L 23/00* (2006.01)
*H01L 23/60* (2006.01)
*H01L 21/56* (2006.01)
*H01L 25/18* (2006.01)
*H01L 23/31* (2006.01)

(52) U.S. Cl.
CPC .............. *H01L 24/48* (2013.01); *H01L 24/73* (2013.01); *H01L 24/83* (2013.01); *H01L 24/85* (2013.01); *H01L 24/92* (2013.01); *H01L 25/18* (2013.01); *H01L 25/50* (2013.01); *H01L 24/33* (2013.01); *H01L 2224/32145* (2013.01); *H01L 2224/32225* (2013.01); *H01L 2224/33181* (2013.01); *H01L 2224/4845* (2013.01); *H01L 2224/48091* (2013.01); *H01L 2224/48106* (2013.01); *H01L 2224/48145* (2013.01); *H01L 2224/48227* (2013.01); *H01L 2224/73215* (2013.01); *H01L 2224/73265* (2013.01); *H01L 2224/92247* (2013.01); *H01L 2225/0651* (2013.01); *H01L 2225/06506* (2013.01); *H01L 2225/06562* (2013.01); *H01L 2225/06586* (2013.01); *H01L 2924/1431* (2013.01); *H01L 2924/1434* (2013.01); *H01L 2924/30205* (2013.01)

(58) Field of Classification Search
CPC . H01L 2224/33181; H01L 2224/48091; H01L 2224/48106; H01L 2224/48145; H01L 2224/48227; H01L 2224/4845; H01L 2224/73215; H01L 2224/73265; H01L 2224/92247; H01L 2225/06506; H01L 2225/0651; H01L 2225/06562; H01L 2225/06586; H01L 2924/1431; H01L 2924/1434; H01L 2924/30205; H01L 25/18; H01L 25/50; H01L 25/0657; H01L 25/00

See application file for complete search history.

(56) References Cited

U.S. PATENT DOCUMENTS

| 9,129,846 | B2* | 9/2015 | Song | H01L 25/105 |
| 9,245,852 | B2* | 1/2016 | Chen | H01L 23/552 |
| 2008/0237645 | A1* | 10/2008 | Uchino | H01L 23/50 |
| | | | | 257/203 |
| 2009/0117729 | A1* | 5/2009 | Huang | H01L 24/05 |
| | | | | 438/613 |
| 2010/0309602 | A1 | 12/2010 | Chien | |
| 2013/0063843 | A1* | 3/2013 | Chen | H01L 25/0652 |
| | | | | 361/56 |
| 2015/0102506 | A1* | 4/2015 | Song | H01L 24/05 |
| | | | | 257/777 |

FOREIGN PATENT DOCUMENTS

| JP | 201 1-61 044 A | 3/2011 |
| JP | 4961148 B2 | 6/2012 |
| JP | 2015-133468 A | 7/2015 |
| KR | 10-2014-0110838 A | 9/2014 |
| KR | 10-2017-0141039 A | 12/2017 |

* cited by examiner

METHOD OF MANUFACTURING A SEMICONDUCTOR PACKAGE

CROSS-REFERENCE TO RELATED APPLICATION

This application claims priority under 35 U.S.C. § 119 to Korean Patent Application No. 10-2018-0162037, filed on Dec. 14, 2018 in the Korean Intellectual Property Office (KIPO), the contents of which are herein incorporated by reference in their entirety.

BACKGROUND

1. Field

Apparatuses and methods consistent with one or more exemplary embodiments relate to a semiconductor package and a method of manufacturing the semiconductor package, and more particularly, to a semiconductor package including a plurality of semiconductor chips stacked in one package and a method of manufacturing the semiconductor package.

2. Description of the Related Art

During manufacture of a semiconductor package, a die attach process may be performed to adhere a plurality of semiconductor chips on a printed circuit board. During the die attach process, highly electrostatic charges may be generated when an adhesive film peels off from an underlying based film. In a related art, an ionizer may be used to remove the generated electrostatic charges. However, it may be difficult to manage the ionizer and a capability of removing the electrostatic charges may be insufficient, thereby causing damage to a logic chip.

SUMMARY

Aspects of one or more exemplary embodiments provide a method of manufacturing a semiconductor package capable of improving product yield and maximizing productivity, and a semiconductor package manufactured by the method.

According to an aspect of an exemplary embodiment, there is provided a method of manufacturing a semiconductor package, the method including arranging a first semiconductor device on a package substrate, forming an electrostatic discharge structure on a ground substrate pad exposed from an upper surface of the package substrate, stacking a plurality of second semiconductor devices on the package substrate and spaced apart from the first semiconductor device, the electrostatic discharge structure being interposed between the first semiconductor device and the plurality of second semiconductor devices, and forming a molding member on the package substrate to cover the first semiconductor device and the plurality of second semiconductor devices.

According to an aspect of another exemplary embodiment, there is provided a method of manufacturing a semiconductor package, the method including providing a package substrate having a ground substrate pad on an upper surface thereof, arranging a first semiconductor device on the package substrate, performing a wire bonding process to electrically connect the first semiconductor device to the package substrate, forming an electrostatic discharge structure on the ground substrate pad during the wire bonding process, stacking a plurality of second semiconductor devices on the package substrate and spaced apart from the first semiconductor device, the electrostatic discharge structure being interposed between the first semiconductor device and the plurality of second semiconductor devices, and forming a molding member on the package substrate to cover the first semiconductor device and the plurality of second semiconductor devices.

According to an aspect of another exemplary embodiment, there is provided a semiconductor package including: a package substrate, a first semiconductor device arranged on the package substrate, a plurality of second semiconductor devices on the package substrate and spaced apart from the first semiconductor device, an electrostatic discharge structure disposed on a ground substrate pad exposed from an upper surface of the package substrate between the first semiconductor device and the plurality of second semiconductor devices, and a molding member on the package substrate to cover the first semiconductor device and the plurality of second semiconductor devices.

According to an aspect of another exemplary embodiment, there is provided a semiconductor package, including a package substrate, a first semiconductor device arranged on the package substrate, a plurality of second semiconductor devices on the package substrate and spaced apart from the first semiconductor device, and an electrostatic discharge structure disposed on a ground substrate pad exposed from an upper surface of the package substrate between the first semiconductor device and the plurality of second semiconductor devices, or disposed on a ground chip pad exposed from an upper surface of the first semiconductor device.

BRIEF DESCRIPTION OF THE DRAWINGS

One or more exemplary embodiments will be more clearly understood from the following detailed description taken in conjunction with the accompanying drawings, in which.

DETAILED DESCRIPTION

Hereinafter, exemplary embodiments will be explained in detail with reference to the accompanying drawings.

Figure 1:
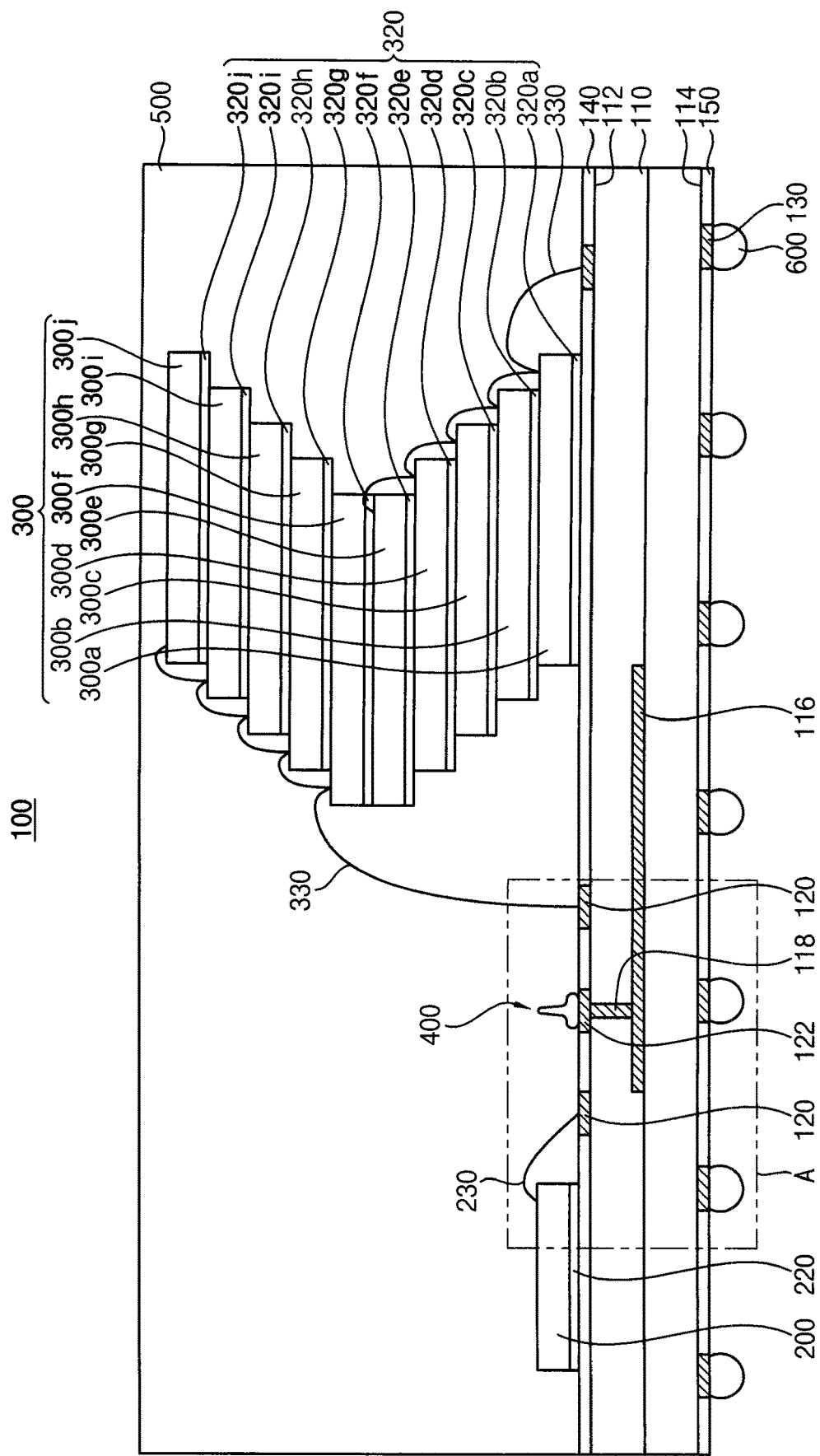
FIG. 1 is a cross-sectional view illustrating a semiconductor package according to an exemplary embodiment.

FIG. 1 is a cross-sectional view illustrating a semiconductor package 100 according to an exemplary embodiment.

Figure 2:
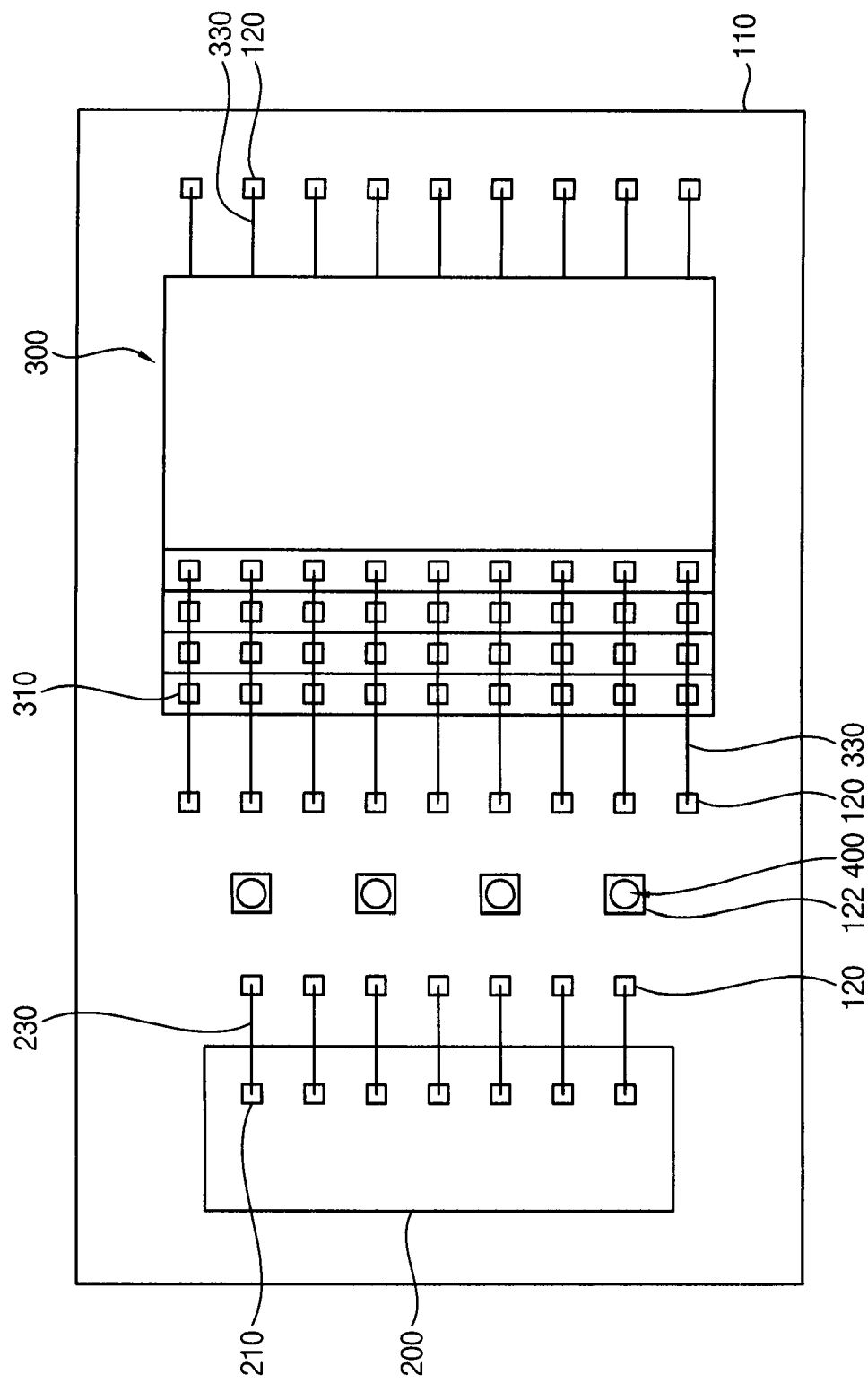
FIG. 2 is a plan view illustrating a semiconductor package according to an exemplary embodiment.
Figure 3:
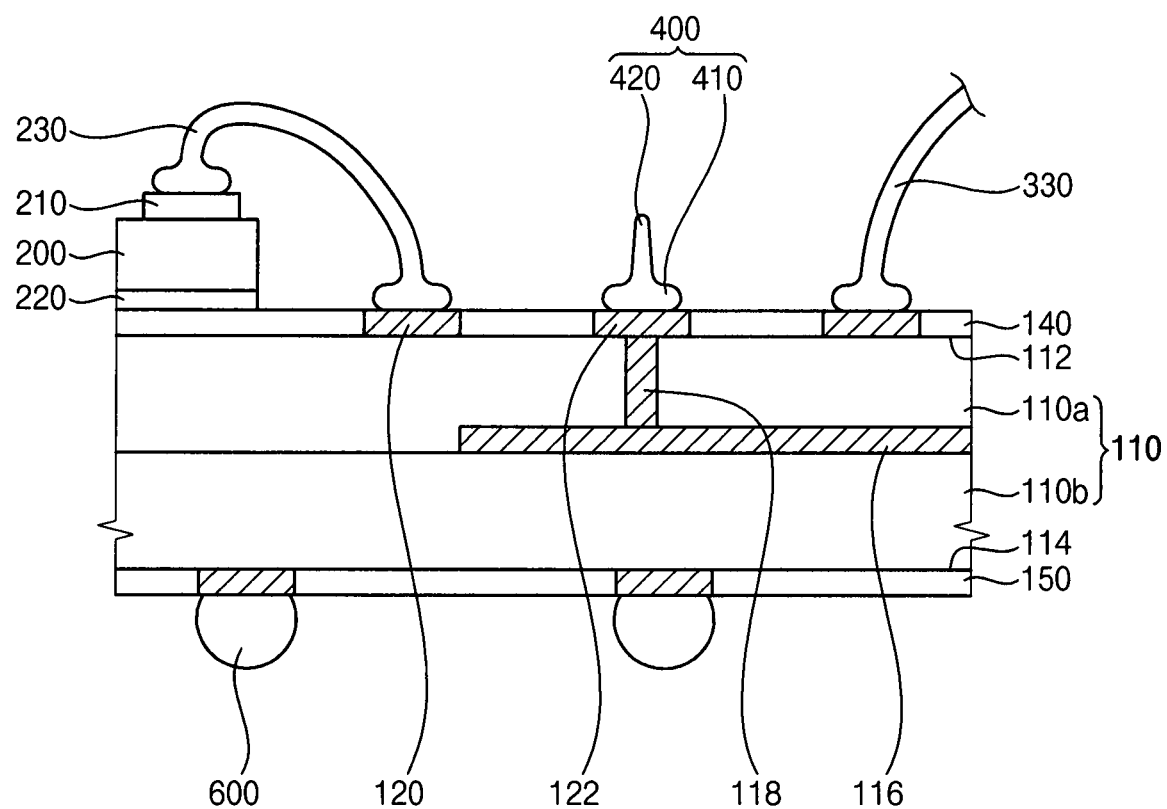
FIG. 3 is an enlarged cross-sectional view of the "A" portion of FIG. 1.

FIG. 2 is a plan view illustrating a semiconductor package according to an exemplary embodiment. FIG. 3 is an enlarged cross-sectional view illustrating the "A" portion of FIG. 1.

Referring to FIGS. 1 to 3, a semiconductor package 100 may include a package substrate 110, a first semiconductor device 200, a plurality of second semiconductor devices 300, at least one electrostatic discharge structure 400, and a molding member 500. Additionally, the semiconductor package 100 may further include outer connection members 600.

The package substrate 110 may be a substrate having an upper surface 112 and a lower surface 114 opposite to each other. For example, the package substrate 110 may include a printed circuit board (PCB). The printed circuit board may include a multi circuit board having vias and various circuit elements therein. The package substrate 110 may include first and second circuit layers 110a, 110b. The package substrate 110 may include a ground plate 116 therein.

Substrate pads 120 may be arranged on the upper surface 112 of the package substrate 110. The substrate pads 120 may respectively be connected to a plurality of wirings. The wirings may extend on the upper surface 112 of the package substrate 110 or inside the package substrate 110. For example, at least a portion of the wiring may be used as the substrate pad, e.g., a landing pad.

At least one ground substrate pad 122 may be arranged on the upper surface 112 of the package substrate 110. The ground substrate pad 122 may be electrically connected to the ground plate 116 by a ground wiring 118. As described below, the ground substrate pad 122, the ground wiring 118 and the ground plate 116 may serve as a ground path capable of safely discharging electrostatic charges on the upper surface 112 of the substrate 110.

In FIGS. 1 to 3, the number and locations of the substrate pads 120 and ground substrate pad 122 are exemplarily illustrated, and it is understood that one or more other exemplary embodiments are not limited thereto.

A first insulation layer 140 may be formed on the upper surface 112 of the package substrate 110 to cover the wirings and expose the substrate pads 120 and the ground substrate pad 122. The first insulation layer 140 may cover the entire upper surface 112 of the package substrate 110 except the substrate pad 120 and the ground substrate pad 122. For example, the first insulation layer may include solder resist.

The first semiconductor device 200 may be mounted on the package substrate 110. The first semiconductor device 200 may be adhered onto the upper surface 112 of the package substrate 110 by an adhesive member 220. For example, the adhesive member may include an adhesive film such as a direct adhesive film (DAF). The first semiconductor device 200 may include an integrated circuit. For example, the first semiconductor device 200 may be a logic chip including a logic circuit. The logic chip may be a controller for controlling memory chips.

The first semiconductor device 200 may include chip pads 210 on an upper surface, that is, an active surface. The chip pads 210 may include an input/output terminal serving as a power pin, an input/output terminal serving as a ground pin and/or an input/output terminal serving as a data pin.

The first semiconductor device 200 may be electrically connected to the package substrate 110 by first conductive connection members 230. In particular, the first conductive connection member 230 may electrically connect the chip pad 210 of the first semiconductor device 200 to the substrate pad 120 of the package substrate 110. For example, the first conductive connection member 230 may include a bonding wire. Accordingly, the first semiconductor device 200 may be stacked on the package substrate 110 by the adhesive member and may be electrically connected to the package substrate 110 by a plurality of the first conductive connection members 230.

Alternatively, the first conductive connection member 230 may include a solder bump, a penetrating electrode, a solder ball, a conductive paste, etc. For example, the first semiconductor device 200 may be mounted on the package substrate 110 in a flip chip bonding manner. In this case, the first semiconductor device may be arranged on the package substrate 110 such that the active surface of the first semiconductor device 200 on which the chip pads 210 are formed faces the package substrate 110. The chip pads 210 of the first semiconductor device 200 may be electrically connected to the substrate pads 120 of the package substrate 110 by the conductive bumps, for example, solder bumps. Additionally, a plurality of the first semiconductor devices 200 may be sequentially stacked on the package substrate 110.

A plurality of second semiconductor devices 300 may be mounted on the package substrate 110. The plurality of second semiconductor devices 300 may be arranged on the package substrate 110 to be spaced apart from the first semiconductor device 200. The plurality of second semiconductor devices 300 may be memory chips including a memory circuit. For example, the plurality of second semiconductor devices 300 may include volatile memory devices such as dynamic random access memory (DRAM), NAND flash memory, etc.

A plurality of the second semiconductor devices 300a, 300b, 300c, 300d, 300e, 300f, 300g, 300h, 300i, 300j may be sequentially adhered onto the upper surface 112 of the package substrate 110 using adhesive members 320a, 320b, 320c, 320d, 320e, 320f, 320g, 320h, 320i, 320j (collectively 320). For example, the adhesive member may include an adhesive film such as a direct adhesive film (DAF).

In particular, second to fifth dies or semiconductor devices 300b, 300c, 300d, 300e of the plurality of second semiconductor devices 300 may be stacked in a first cascade structure. The second to fifth dies 300b, 300c, 300d, 300e may be sequentially offset-aligned in a direction toward the first semiconductor device 200 on the package substrate 110.

Seventh to tenth dies or semiconductor devices 300g, 300h, 300i, 300j of the plurality of second semiconductor devices 300 may be stacked in a second cascade structure. The Seventh to tenth dies 300g, 300h, 300i, 300j may be sequentially offset-aligned in a direction away from the first semiconductor device 200 on the package substrate 110.

The plurality of second semiconductor devices 300 may include chip pads 310 on an upper surface, that is, an active surface. The chip pads 310 may include an input/output terminal serving as a power pin, an input/output terminal serving as a ground pin and/or an input/output terminal serving as a data pin.

The plurality of second semiconductor devices 300 may be electrically connected to the package substrate 110 by third conductive connection members 330. In particular, the third conductive connection member 330 may electrically connect the chip pads 310 of each of the plurality of second semiconductor device 300 to the substrate pads 120 of the package substrate 110. For example, the third conductive connection member 330 may include a bonding wire. Accordingly, the plurality of second semiconductor devices 300 may be stacked on the package substrate 110 by the adhesive member and may be electrically connected to the package substrate 110 by a plurality of the third conductive connection members 330.

The number, sizes, locations, etc., of the second semiconductor devices 300 are exemplarily illustrated, and it is understood that one or more other exemplary embodiments are not limited thereto.

The electrostatic discharge structure 400 may be disposed on the at least one ground substrate pad 122 exposed from the second surface 112 of the package substrate 110. The electrostatic discharge structure 400 may be disposed on the ground substrate pad 122 between the first semiconductor device 200 and the plurality of second semiconductor devices 300. A plurality of the ground substrate pads 122 may be arranged along a side of the first semiconductor device 200, and a plurality of the ground discharge structures 400 may be respectively disposed on the ground substrate pads 122.

For example, the electrostatic discharge structure 400 may include a metal material such as gold (Au), copper (Cu), aluminum (Al), etc. The electrostatic discharge structure 400 may be formed using a wire that is withdrawn or drawn from a wire bonding apparatus. The height, thickness, material, etc., of the electrostatic discharge structure 400 may be determined in consideration of a voltage level of the electrostatic charges, dimensions of the first and second semiconductor devices 200 and 300, etc.

As illustrated in FIG. 3, the electrostatic discharge structure 400 may include a bonding portion 410 bonded to the ground substrate pad 122 and a tip portion 420 extending a predetermined height from the bonding portion 410. The tip portion 420 may include a sharp top portion. Accordingly, electrostatic charges generated when the plurality of second semiconductor devices 300 are stacked on the package substrate 110 using the adhesive film may be discharged safely through the electrostatic discharge structure 400 and the ground path in the package substrate 110.

The molding member 500 may be formed on the package substrate 110 to protect the first semiconductor device 200 and the plurality of second semiconductor devices 300 from the surrounding environment. The molding member may include epoxy molding compound (EMC).

Outer connection pads 130 for supplying an electrical signal may be formed on the lower surface 114 of the package substrate 110. The outer connection pads 130 may be exposed from a second insulation layer 150. The second insulation layer 150 may include a silicon oxide layer, a silicon nitride or a silicon oxynitride layer. An outer connection member 600 for electrical connection with an external device may be disposed on the outer connection pad 130. For example, the outer connection member 600 may include a solder ball. The semiconductor package 100 may be mounted on a module substrate via the solder balls to form a memory module.

As described above, the semiconductor package 100 may include the at least one electrostatic discharge structure 400 disposed on the ground substrate pad 122 between the first semiconductor device 200 and the plurality of second semiconductor devices 300. The electrostatic discharge structure 400 may be grounded through the ground plate 116 electrically connected to the ground substrate pad 122.

Accordingly, the electrostatic discharge structure 400 may be arranged adjacent to the first semiconductor device 200 to prevent the first semiconductor device 200 from being damaged due to the electrostatic charges generated during a die attach process of the plurality of second semiconductor devices 300. Thus, product yield of the semiconductor package 100 may be improved and productivity may be maximized.

Hereinafter, a method of manufacturing the semiconductor package 100 in FIG. 1 will be explained.

FIGS. 4 to 13 are views illustrating a method of manufacturing a semiconductor package 100 according to one or more exemplary embodiments.

Figure 4:
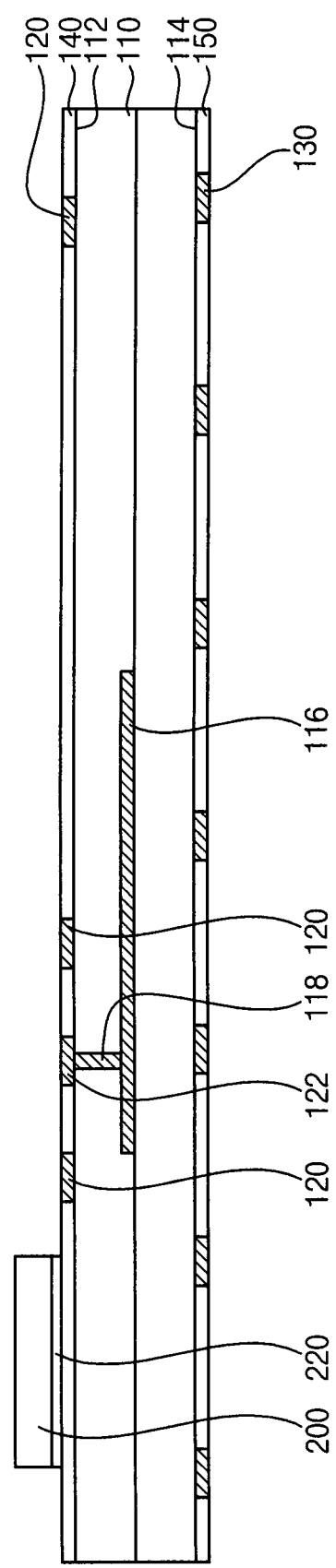
FIGS. 4 to 13 are views illustrating a method of manufacturing a semiconductor package according to one or more exemplary embodiments.

Referring to FIG. 4, a package substrate 110 having at least one ground substrate pad 122 may be provided, and a first semiconductor device 200 may be stacked or provided (e.g., arranged) on the package substrate 110.

The package substrate 110 may be a substrate having an upper surface 112 and a lower surface 114 opposite to each other. For example, the package substrate 110 may include a printed circuit board (PCB). The printed circuit board may include a multi circuit board having vias and various circuit elements therein. The package substrate 110 may include a first circuit layer 110a and a second circuit layer 110b as described above with reference to FIG. 3. The package substrate 110 may include a ground plate 116 therein.

Substrate pads 120 may be arranged on the upper surface 112 of the package substrate 110. The substrate pads 120 may be respectively connected to a plurality of wirings. The plurality of wirings may extend from the upper surface 112 of the package substrate 110 and/or extend inside the package substrate 110. For example, at least a portion of the wiring may be used as the substrate pad, e.g., a landing pad.

The at least one ground substrate pad 122 may be arranged on the upper surface 112 of the package substrate 110. The at least one ground substrate pad 122 may be electrically connected to the ground plate 116 by a ground wiring 118. The at least one ground substrate pad 122, the ground wiring 118 and the ground plate 116 may serve as a ground path capable of safely discharging electrostatic charges generated on the upper surface 112 of the substrate 110.

The first semiconductor device 200 may be stacked (e.g., arranged) on the upper surface 112 of the package substrate 110. The first semiconductor device 200 may be adhered onto the upper surface 112 of the package substrate 110 by an adhesive member 220. For example, the adhesive member may include an adhesive film such as a direct adhesive film (DAF). The first semiconductor device 200 may include an integrated circuit. For example, the first semiconductor device 200 may be a logic chip including a logic circuit. The logic chip may be a controller for controlling memory chips.

Figure 5:
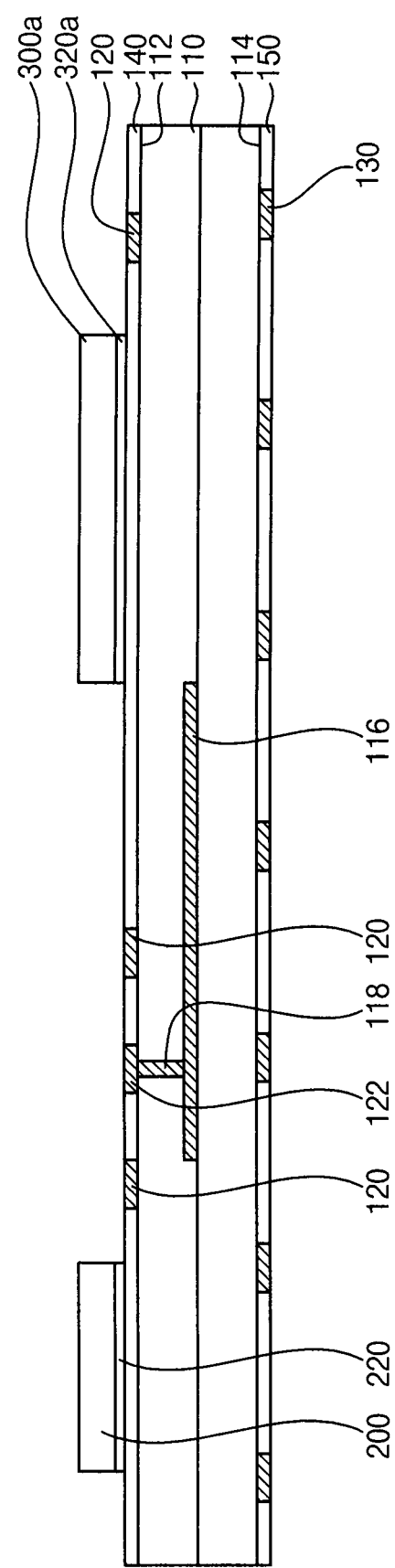

Referring to FIG. 5, a first group 300a of a plurality of second semiconductor devices 300 may be arranged on the package substrate 110. For example, at least one second semiconductor device, that is, a first die 300a, may be arranged on the package substrate 110. The first die 300a may be arranged on the package substrate 110 to be spaced apart from the first semiconductor device 200. The ground substrate pad 122 may be arranged between the first semiconductor device 200 and the first die 300a.

The first die 300a may be adhered onto the package substrate 110 using an adhesive member 320a. For example, the adhesive member 320a may include an adhesive film such as a direct adhesive film (DAF). Further, and by way of example, the second semiconductor device 300 may include volatile memory devices such as DRAM, NAND flash memory, etc.

Figure 6:
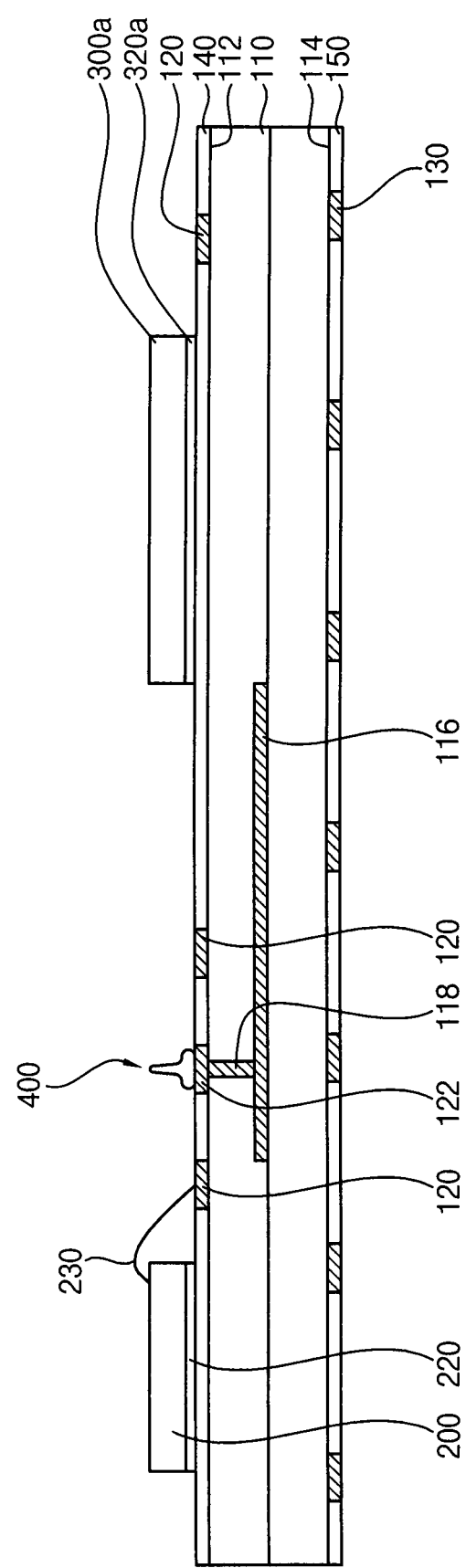
Figure 7:
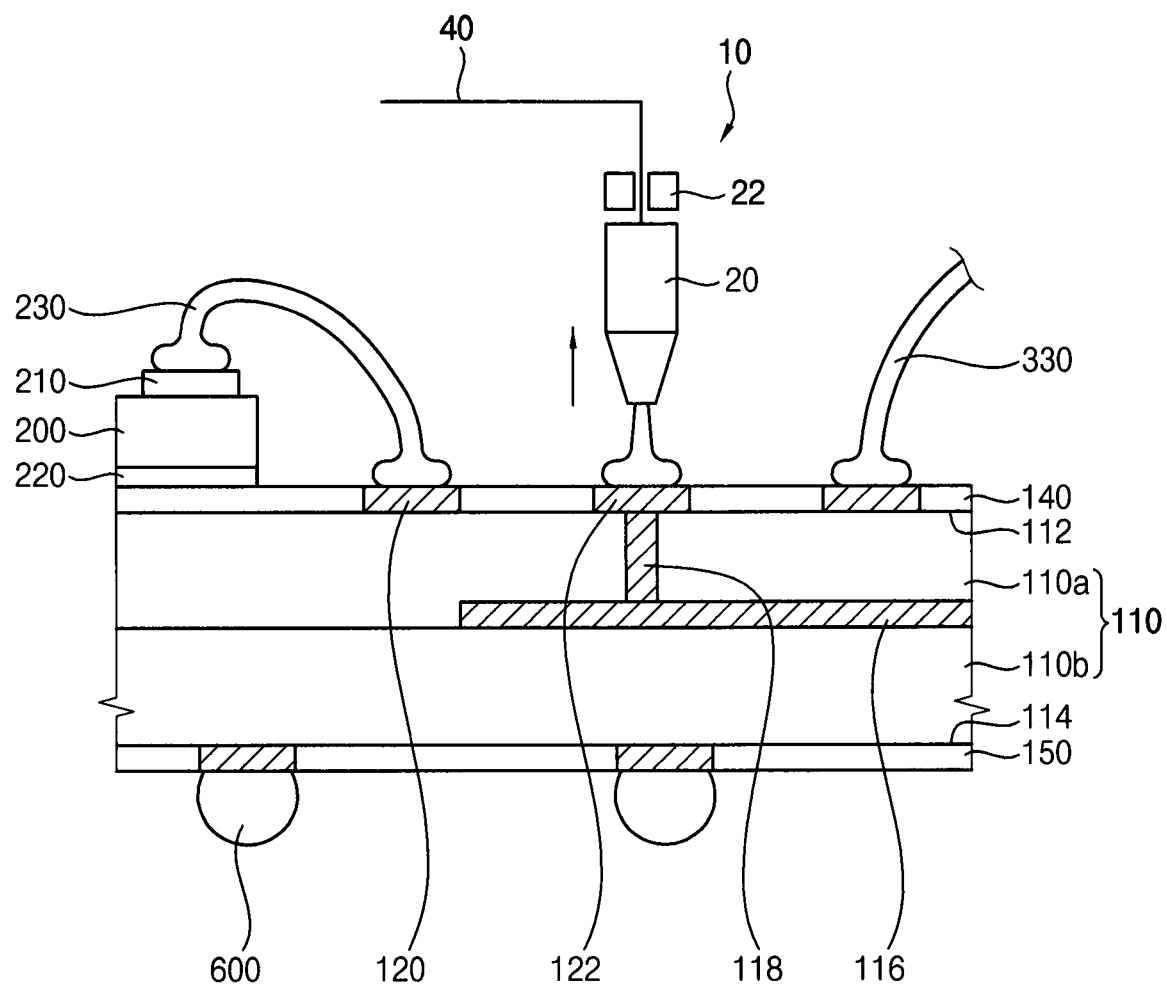
Figure 8:
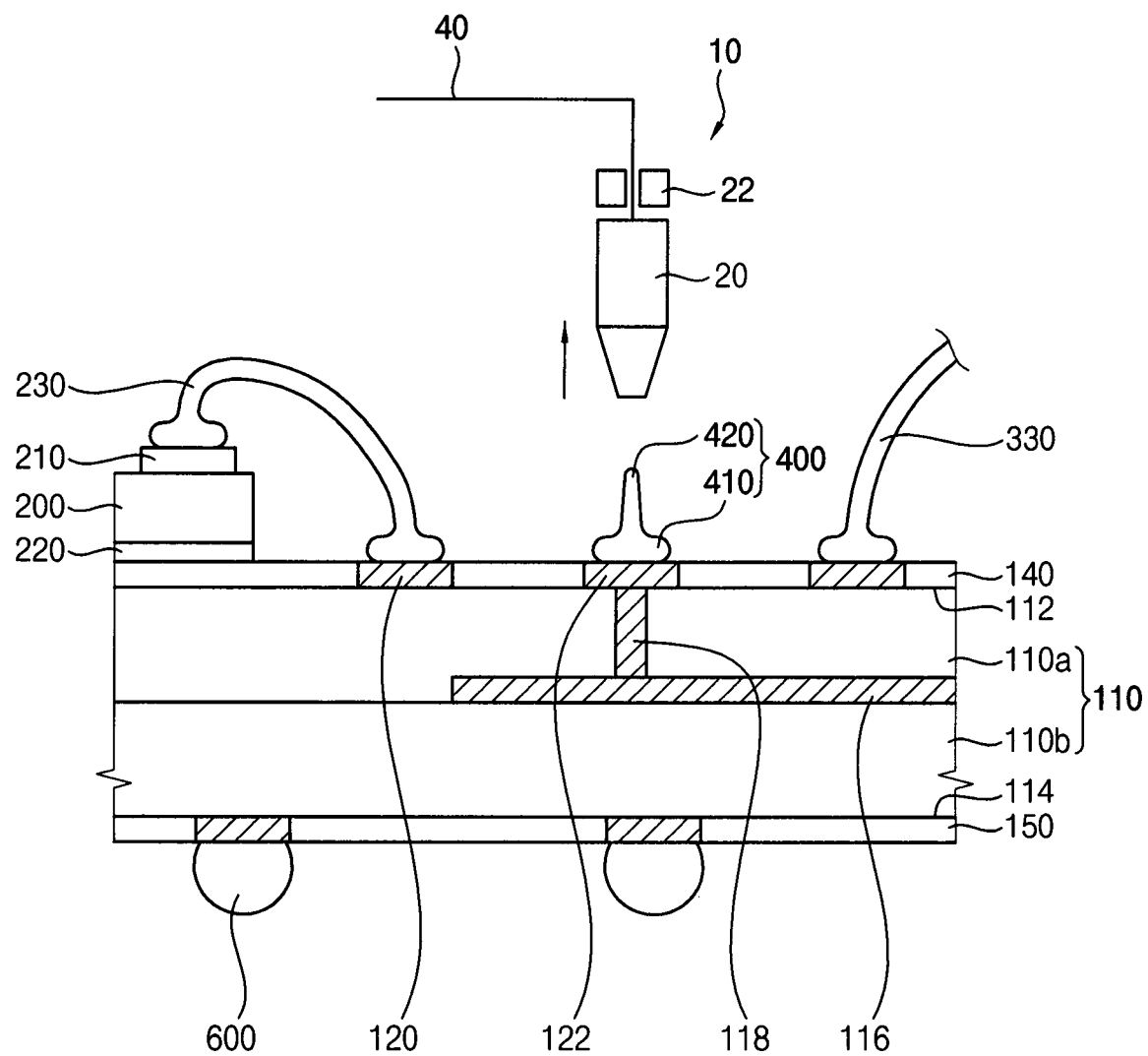

Referring to FIGS. 6 to 8, a wire bonding process may be performed to electrically connect the first semiconductor device 200 to the package substrate 110, and an electrostatic discharge structure 400 may be formed on the ground substrate pad 122 during the wiring bonding process.

First, the wiring bonding process may be performed to connect chip pads 210 of the first semiconductor device 200 to substrate pads 120 on the upper surface 112 of the package substrate 110. The chip pads 210 of the first semiconductor device 200 may be connected to the substrate pad 120 by first conductive connection members 230, for example, bonding wires.

In particular, a capillary 20 of a wiring bonding apparatus 10 may move to the chip pad 210 to bond a wire 40 to the chip pad 210. A ball formed by a discharge torch may be compressed on the chip pad 210 such that a tip end of the wire 40 may be bonded to the chip pad 210. While the wire 40 is withdrawn from the capillary 20, the wire 40 may move from the chip pad 210 to the substrate pad 120 to be bonded to the substrate pad 120.

Then, the electrostatic discharge structure 400 may be formed on the ground substrate pad 122.

As illustrated in FIGS. 7 and 8, the capillary 20 of the wiring bonding apparatus 10 may move to the ground substrate pad 122 to bond a wire 40 to the ground substrate pad 122. A ball formed by the discharge torch may be compressed on the ground substrate pad 122 such that a tip end of the wire 40 may be bonded to the ground substrate pad 122. The capillary 20 may move upwardly to withdraw the wire 40 to a predetermined height and a clamp 22 may cut the wire 40, to form a wire bump 400 having a tip portion in an upper end portion.

The wire bump-shaped electrostatic discharge structure 400 may include a bonding portion 410 bonded to the ground substrate pad 122 and a tip portion 420 extending to a predetermined height from the bonding portion 410. The tip portion 420 may include a sharp top portion. Accordingly, electrostatic charges generated when second semiconductor devices 300 are stacked on the package substrate 110 by a following die attach process may be discharged safely through the electrostatic discharge structure 400 and the ground path in the package substrate 110.

Referring to FIGS. 9 to 12, a second group 300*b*, 300*c*, 300*d*, 300*e* of the plurality of second semiconductor devices 300 may be stacked on the package substrate 110, and a wire bonding process may be performed to electrically connect the second semiconductor devices 300 to the package substrate 110.

Figure 9:
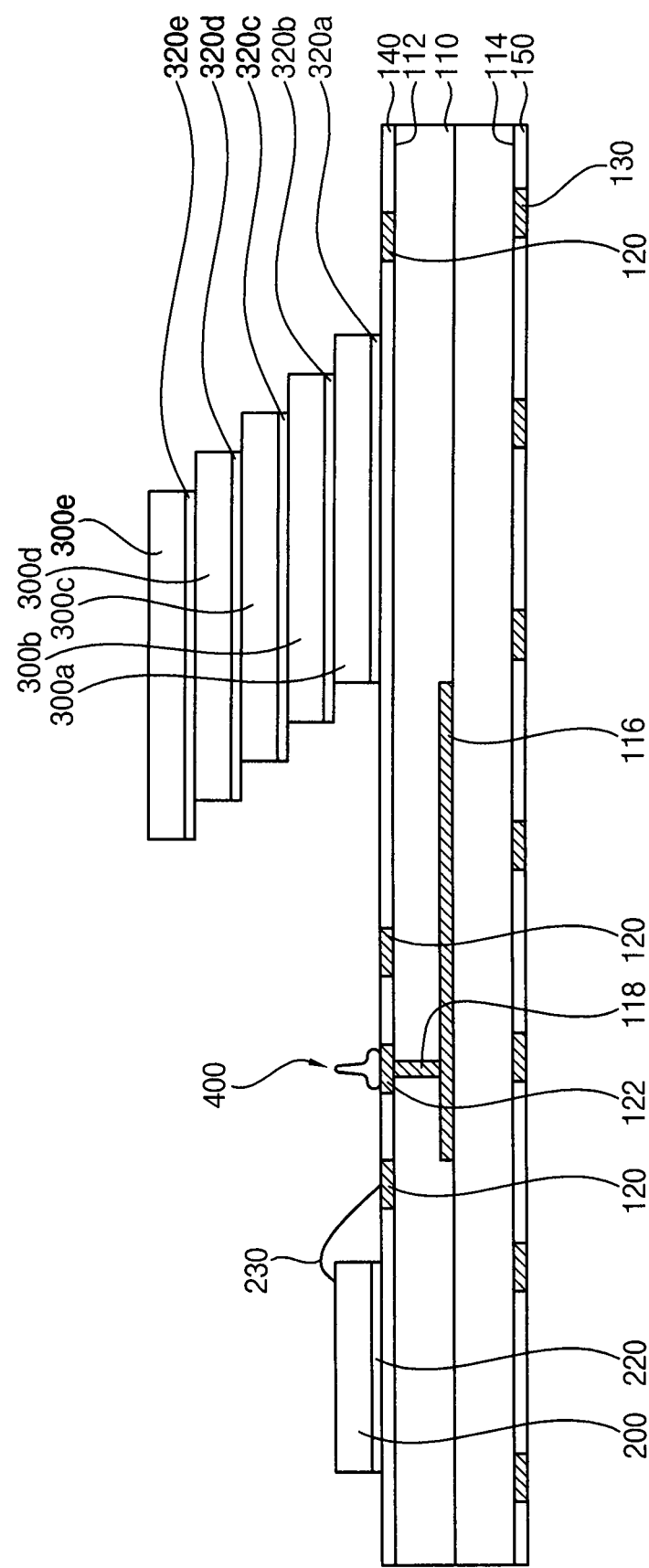
Figure 10:
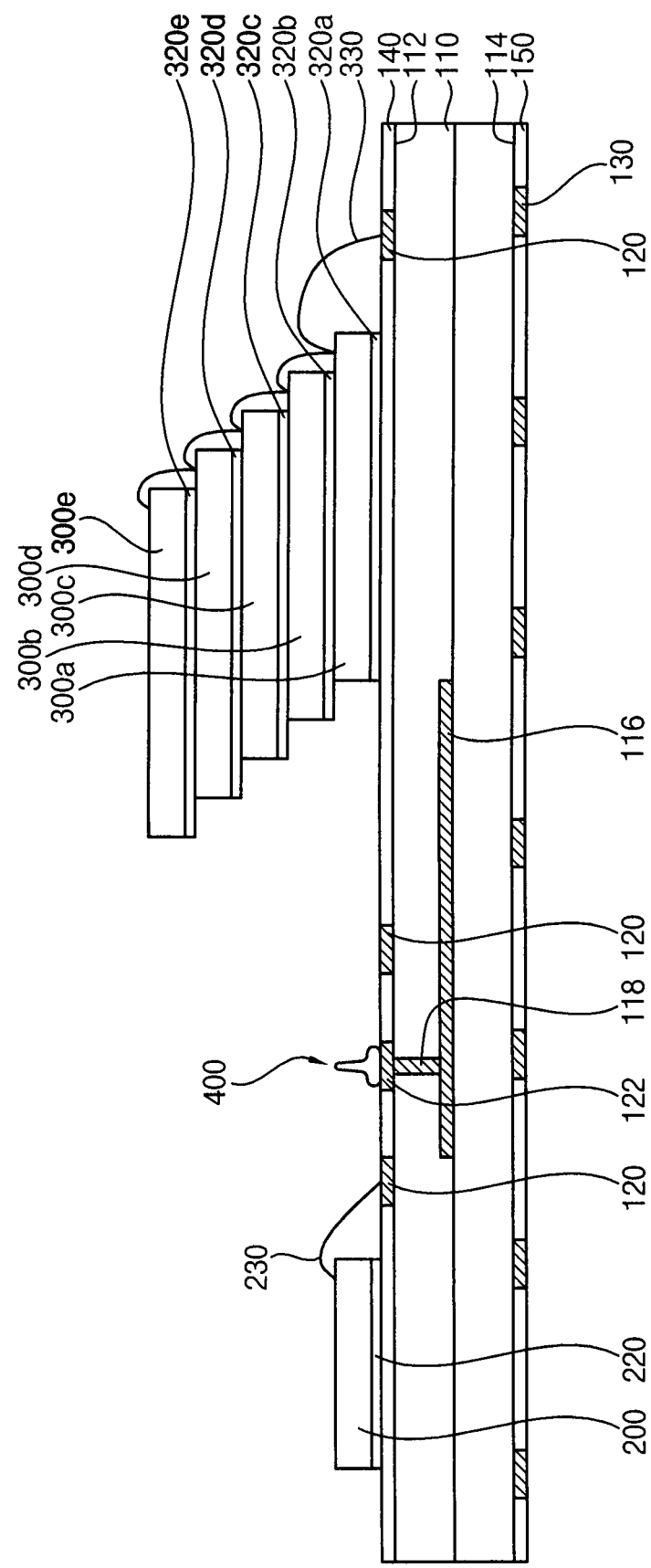

First, as illustrated in FIGS. 9 and 10, a die attach process may be performed to arrange the second group 300*b*, 300*c*, 300*d*, 300*e* of the second semiconductor devices 300 on the first group 300*a* of the second semiconductor devices 300. Second to fifth dies 300*b*, 300*c*, 300*d*, 300*e* of the second semiconductor devices 300 may be stacked on the first die 300*a*, and the first to fifth dies 300*a*, 300*b*, 300*c*, 300*d*, 300*e* may be electrically connected to the package substrate 110.

The second to fifth dies 300*b*, 300*c*, 300*d*, 300*e* may be stacked in a first cascade structure. The second to fifth dies 300*b*, 300*c*, 300*d*, 300*e* may be sequentially offset-aligned in a direction toward the first semiconductor device 200 on the package substrate 110. The second to fifth dies 300*b*, 300*c*, 300*d*, 300*e* may be adhered onto the package substrate 110 using an adhesive film 320*b*, 320*c*, 320*d*, 320*e* such as a direct adhesive film (DAF).

While the die attach process is performed, highly electrostatic charges may be generated when the adhesive film 320*a*, 320*b*, 320*c*, 320*d*, 320*e* peels off from an underlying based film. As the dies 300*a*, 300*b*, 300*c*, 300*d*, 300*e* are stacked on one another, the stacked dies may be closer to the first semiconductor device 200 due to the cascade structure. As a result, it may be possible that the first semiconductor device 200 is damaged by the generated electrostatic charges. In this case, the generated electrostatic charges may be discharged safely through the electrostatic discharge structure 400 to thereby prevent the first semiconductor device 200 from being damaged by the electrostatic charges.

The wiring bonding process may be performed to connect chips pads 310 of the second to fifth dies 300*b*, 300*c*, 300*d*, 300*e* to the substrate pads 120 on the upper surface 112 of the package substrate 110. The chip pads 310 of the second to fifth dies 300*b*, 300*c*, 300*d*, 300*e* may be connected to the substrate pad 120 by second conductive connection members 330, for example, bonding wires 330.

Figure 11:
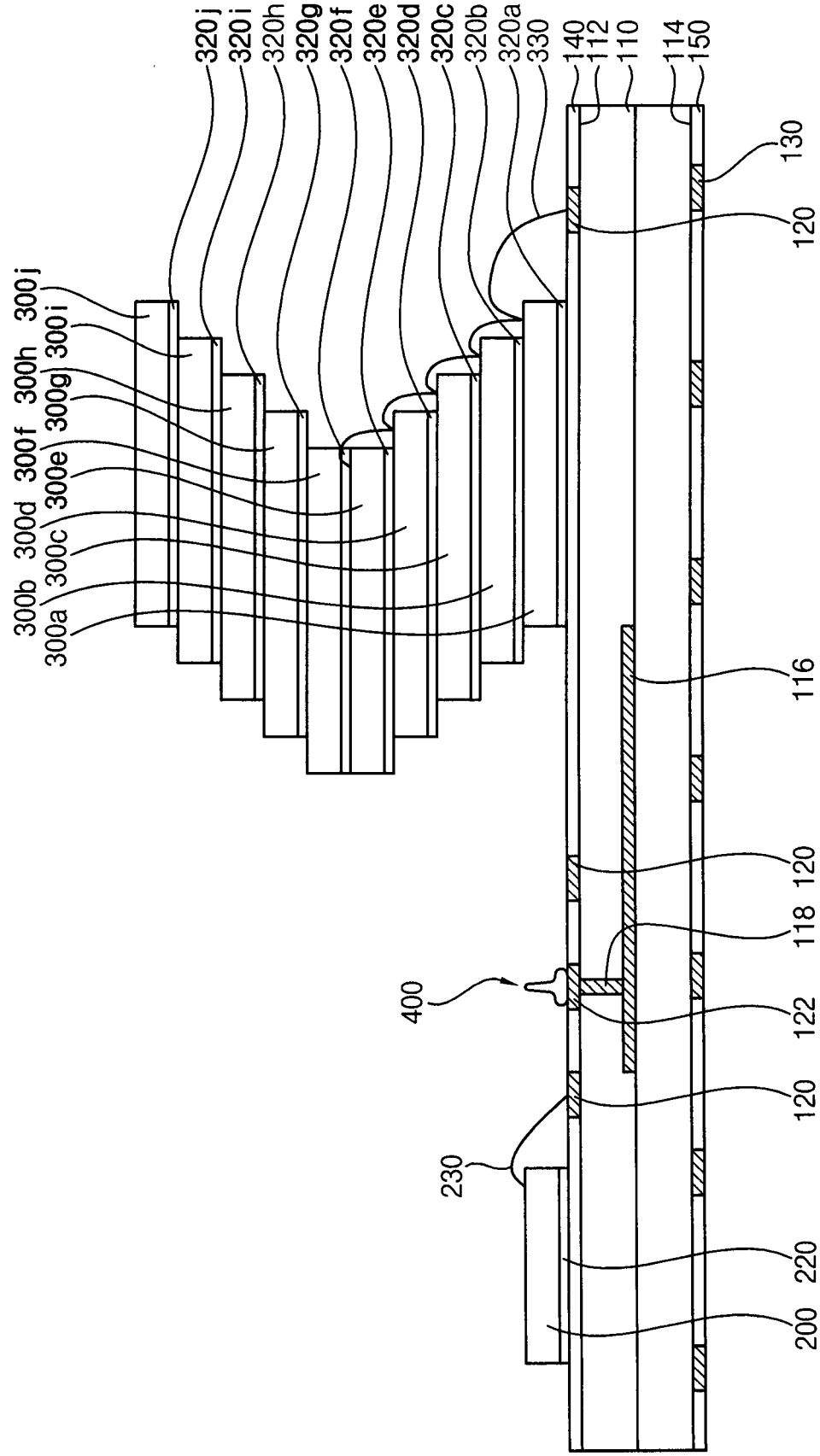
Figure 12:
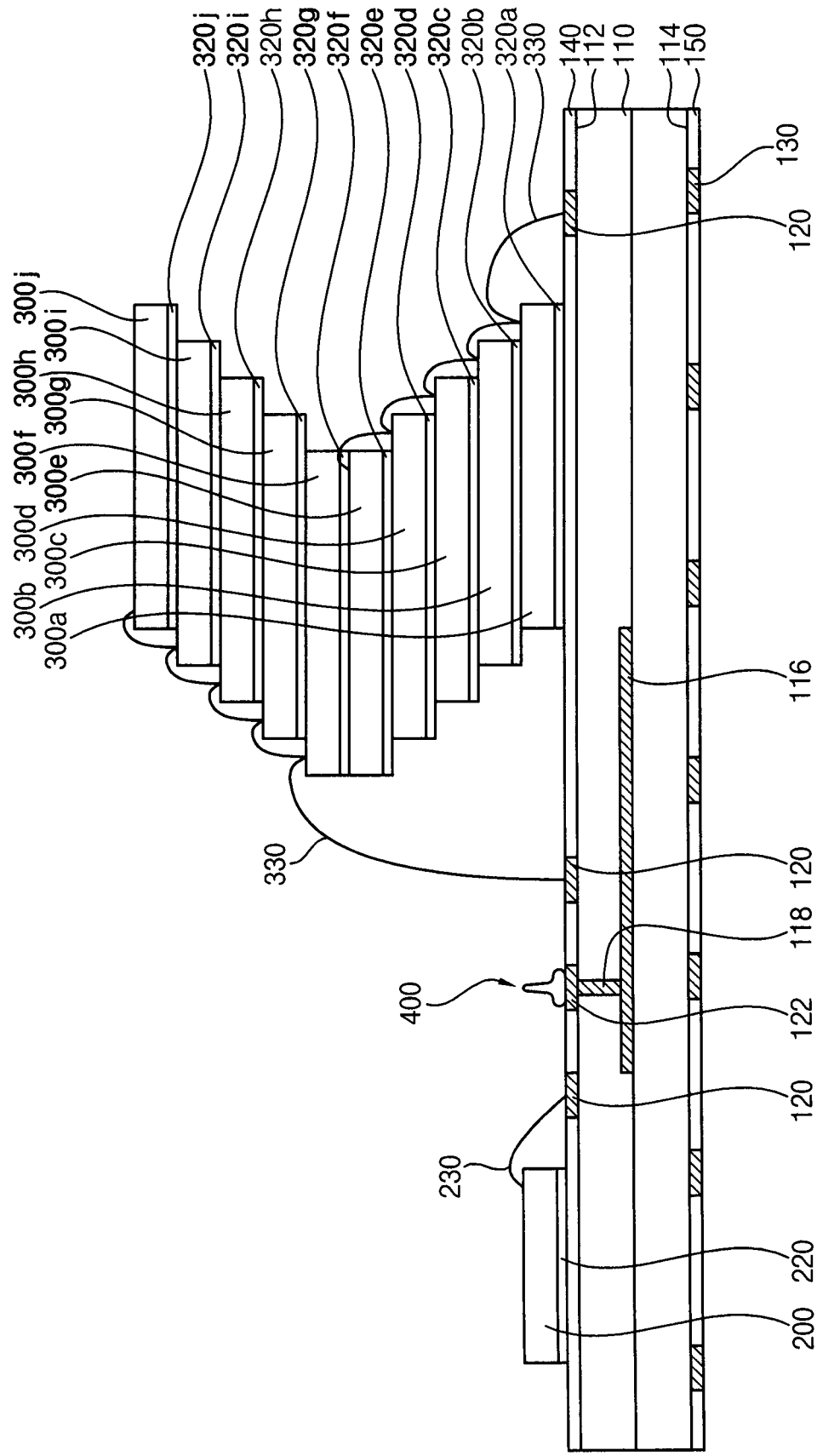

As illustrated in FIGS. 11 and 12, a die attach process may be performed to stack sixth to tenth dies 300*f*, 300*g*, 300*h*, 300*i*, 300*j* of the second semiconductor devices 300 on the fifth die 300*e*, and the sixth to tenth dies 300*f*, 300*g*, 300*h*, 300*i*, 300*j* may be electrically connected to the package substrate 110.

The sixth to tenth dies 300*f*, 300*g*, 300*h*, 300*i*, 300*j* may be stacked in a second cascade structure. The sixth to tenth dies 300*f*, 300*g*, 300*h*, 300*i*, 300*j* may be sequentially offset-aligned in a direction away from the first semiconductor device 200 on the package substrate 110. The sixth to tenth dies 300*f*, 300*g*, 300*h*, 300*i*, 300*j* may be adhered onto the package substrate 110 using an adhesive film 320*f*, 320*g*, 320*h*, 320*i*, 320*j* such as a direct adhesive film (DAF).

The wiring bonding process may be performed to connect chips pads 310 of the sixth to tenth dies 300*f*, 300*g*, 300*h*, 300*i*, 300*j* to the substrate pads 120 on the upper surface 112 of the package substrate 110. The chip pads 310 of the sixth to tenth dies 300*f*, 300*g*, 300*h*, 300*i*, 300*j* may be connected to the substrate pad 120 by the second conductive connection members 330, for example, bonding wires.

Figure 13:
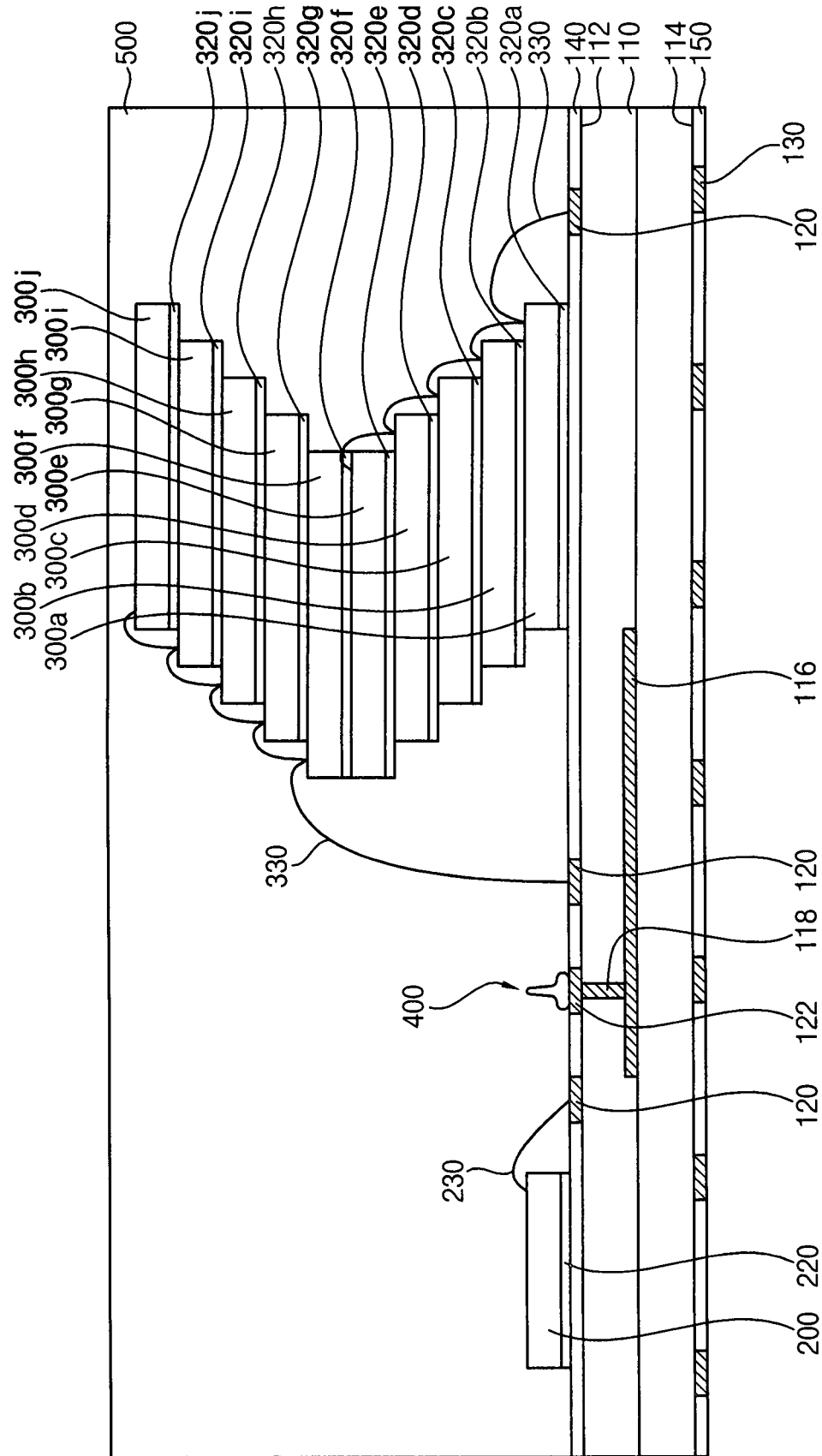

Referring to FIG. 13, a molding member 500 may be formed on the package substrate 110 to cover the first semiconductor device 200 and the second semiconductor devices 300. The molding member 500 may include epoxy molding compound (EMC).

Outer connection members 600 may be formed on outer connection pads 130 on the lower surface 114 of the package substrate 110, to complete a semiconductor package 100.

As mentioned above, in the method of manufacturing the semiconductor package, after the first semiconductor device 200 is adhered onto the package substrate 110, the wire bonding process may be performed to form the electrostatic discharge structure 400 on the ground substrate pad 122 of the package substrate 110. Then, the die attach process may be performed to adhere a plurality of the second semiconductor devices 300 on the package substrate 110.

While the die attach process is performed, highly electrostatic charges may be generated when the adhesive film 320 peels off from an underlying based film. The generated electrostatic charges may be discharged safely through the electrostatic discharge structure 400 arranged adjacent to the first semiconductor device 200, to thereby prevent the first semiconductor device 200 from being damaged by the electrostatic charges.

Figure 14:
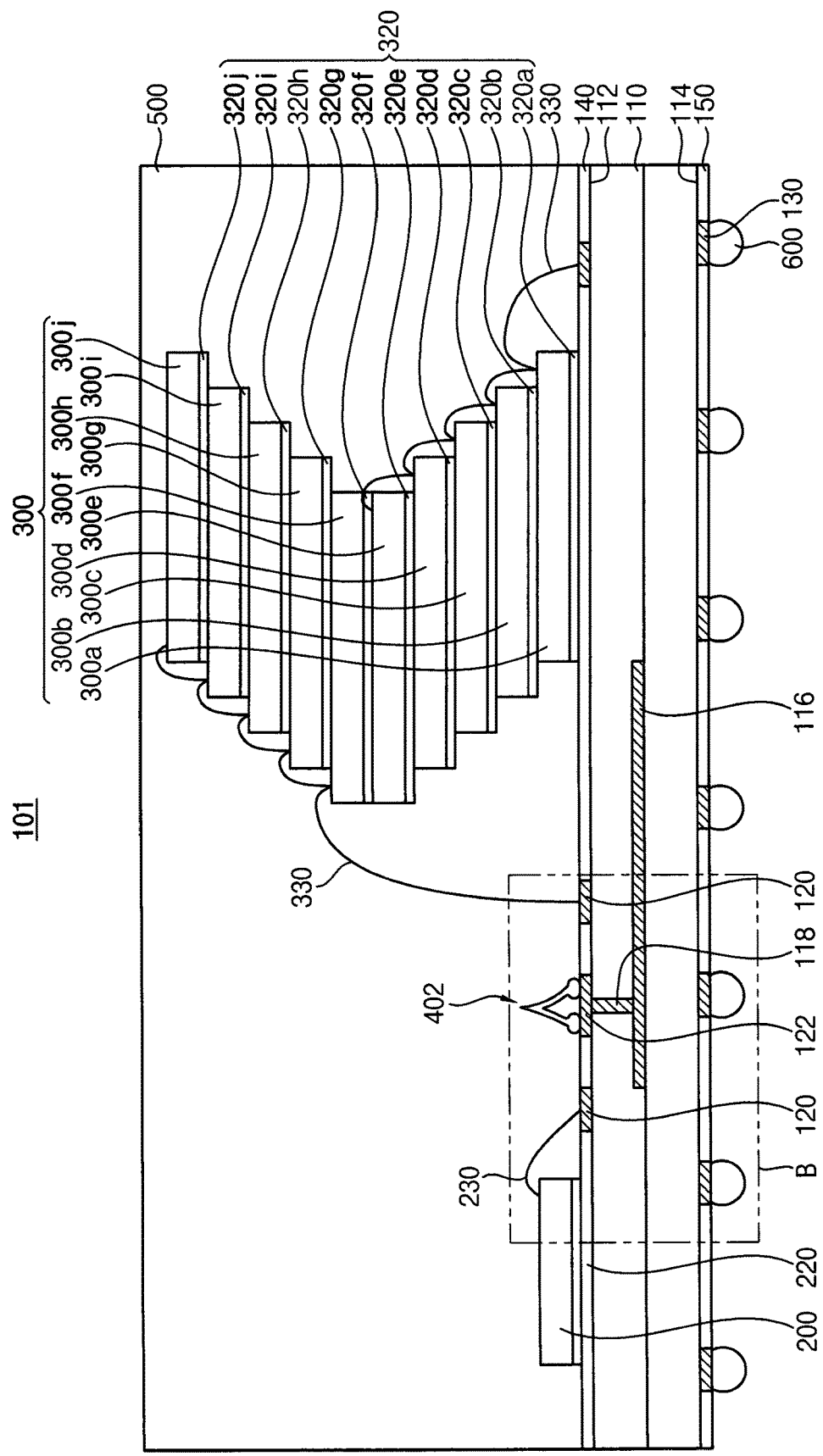
FIG. 14 is a cross-sectional view illustrating a semiconductor package according to an exemplary embodiment.
Figure 15:
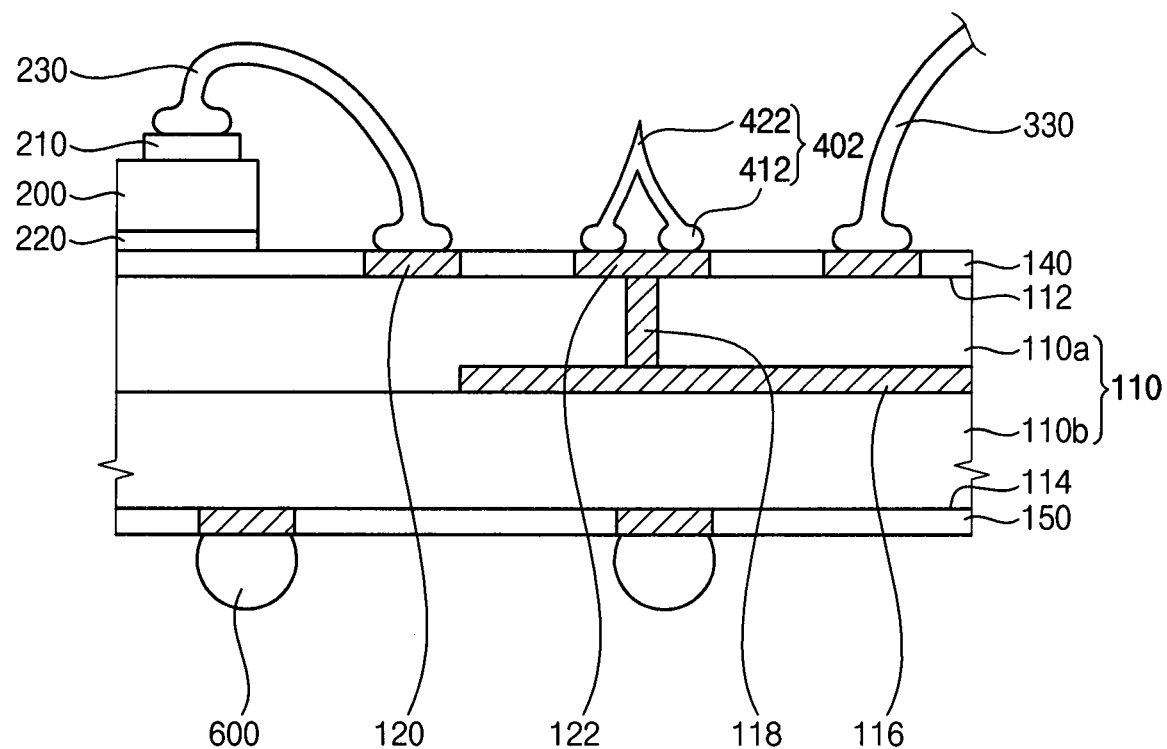
FIG. 15 is an enlarged cross-sectional view illustrating the "B" portion of FIG. 14.

FIG. 14 is a cross-sectional view illustrating a semiconductor package 101 according to an exemplary embodiment. FIG. 15 is an enlarged cross-sectional view illustrating the "B" portion of FIG. 14. The semiconductor package 101 may be substantially the same as or similar to the semiconductor package 100 described with reference to FIG. 1 except for an electrostatic discharge structure 400, 402. Thus, same reference numerals will be used to refer to the same or like elements and any further repetitive explanation concerning the above elements may be omitted.

Referring to FIGS. 14 and 15, an electrostatic discharge structure 402 of a semiconductor package 101 may include first and second bonding portions 412 bonded to a substrate pad 122 and an arch-shaped connection portion 422 connected to the first and second bonding portions 412.

Accordingly, electrostatic charge generated when second semiconductor devices 300 are stacked on a package substrate 110 using adhesive films 320 may be discharged safely through the electrostatic discharge structure 402 and a discharge path in the package substrate 110.

Hereinafter, a method of manufacturing the semiconductor package 101 in FIG. 14 will be explained.

Figure 16:
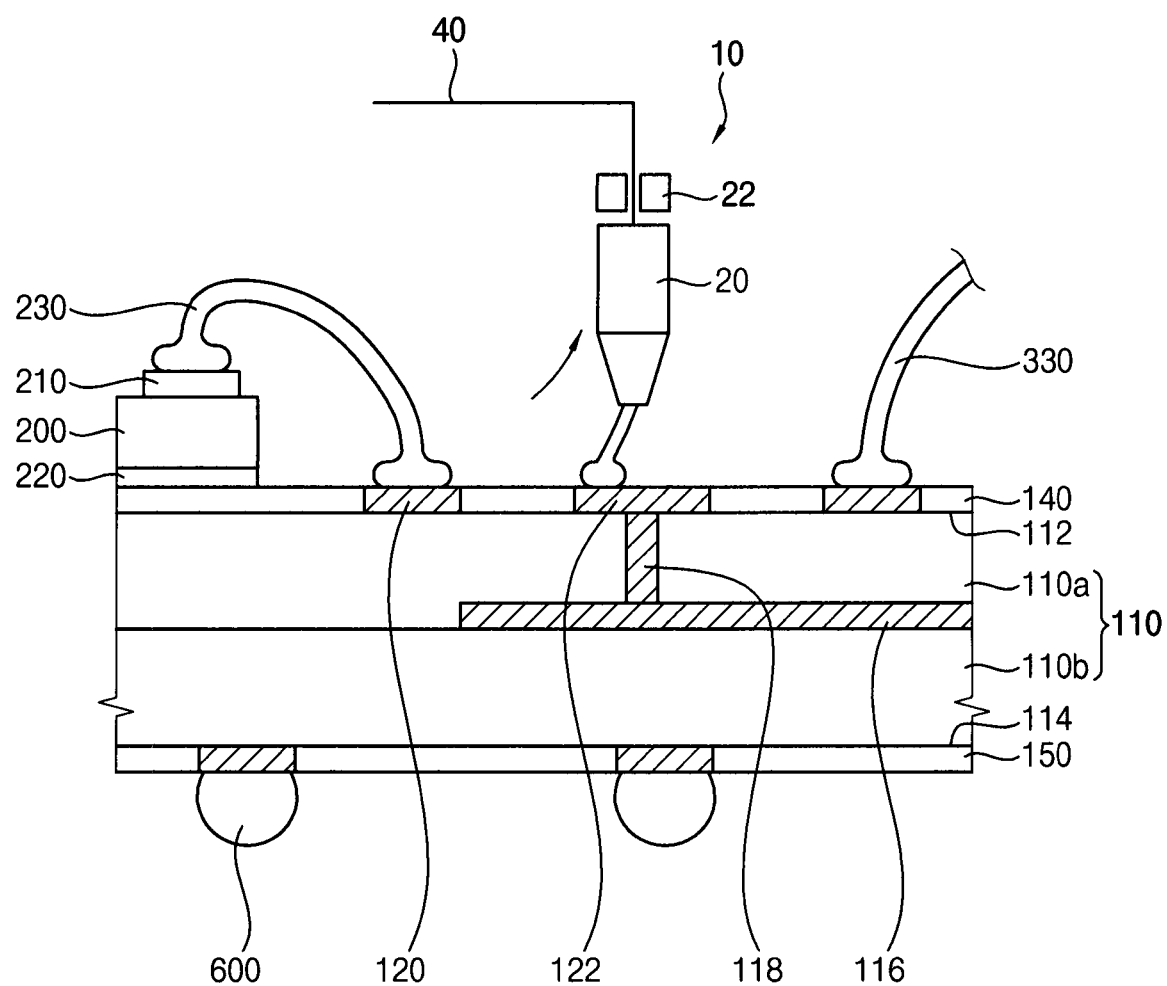
FIGS. 16 and 17 are cross-sectional views illustrating a method of manufacturing a semiconductor package according to one or more exemplary embodiments.
Figure 17:
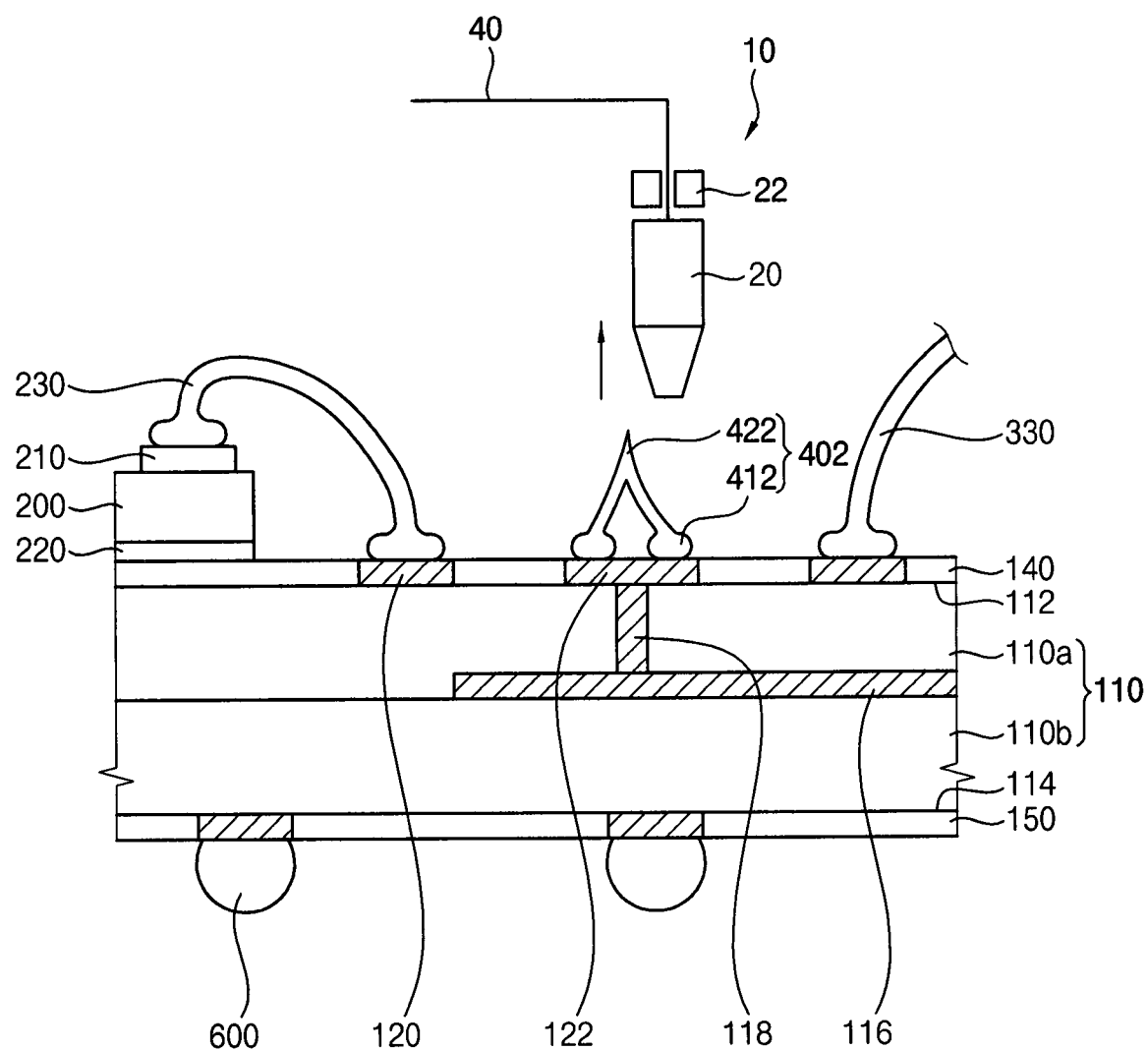

FIGS. 16 and 17 are cross-sectional views illustrating a method of manufacturing a semiconductor package 101 according to one or more exemplary embodiments.

Referring to FIGS. 16 and 17, first, processes similar to the processes described above with reference to FIGS. 4 and 5 may be performed to arrange a first semiconductor device 200 and at least one second semiconductor device 300 on a package substrate 110, a wire bonding process may be performed to electrically connect the first semiconductor device 200 to the package substrate 110, and an electrostatic discharge structure 402 may be formed on a ground substrate pad 122 during the wiring bonding process.

In particular, a capillary 20 of a wiring bonding apparatus 10 may move to a first side of a ground substrate pad 122 to bond a wire 40 to the first side of the ground substrate pad 122. A ball formed by a discharge torch may be compressed on the ground substrate pad 122 such that a tip end of the wire 40 may be bonded to the ground substrate pad 122. While the capillary 20 moves to a second side of the ground substrate pad 122, the capillary 20 may move upwardly to withdraw the wire 40 to a predetermined height and then move downwardly to the second side of the ground substrate pad 122 to bond the wire 40 to the second side of the ground substrate pad 122.

The arch-shaped electrostatic discharge structure 402 may include first and second bonding portions 412 bonded to a substrate pad 122 and an arch-shaped connection portion 422 connected to the first and second bonding portions 412. The connection portion 422 may include a sharp top portion.

Accordingly, electrostatic charge generated when second semiconductor devices 300 are stacked on the package substrate 110 by a following die attach process may be discharged safely through the electrostatic discharge structure 402 and a discharge path in the package substrate 110.

Then, processes similar to the processes described above with reference to FIGS. 9 to 12 may be performed to stack a plurality of the second semiconductor devices 300 on the package substrate 110, and a wire bonding process may be performed to electrically connect the second semiconductor devices 300 to the package substrate 110.

Then, processes similar to the processes described above with reference to FIG. 13 may be performed to form a molding member 500 on the package substrate 110 to cover the first semiconductor device 200 and the second semiconductor devices 300. The molding member 500 may include epoxy molding compound (EMC).

Outer connection members 600 may be formed on outer connection pads 130 on a lower surface 114 of the package substrate 110, to complete a semiconductor package 101.

Figure 18:
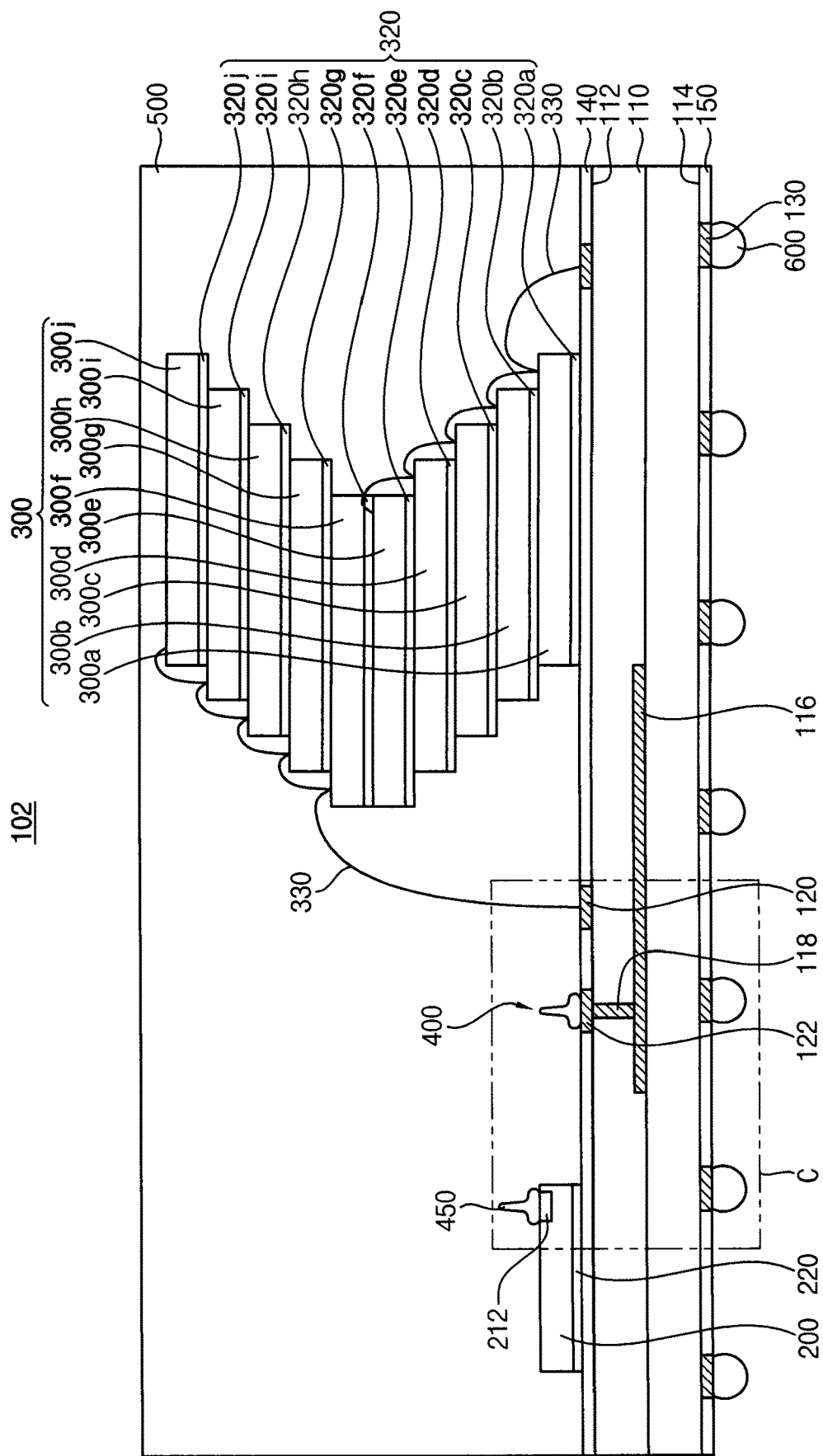
FIG. 18 is a cross-sectional view illustrating a semiconductor package according to an exemplary embodiment.
Figure 19:
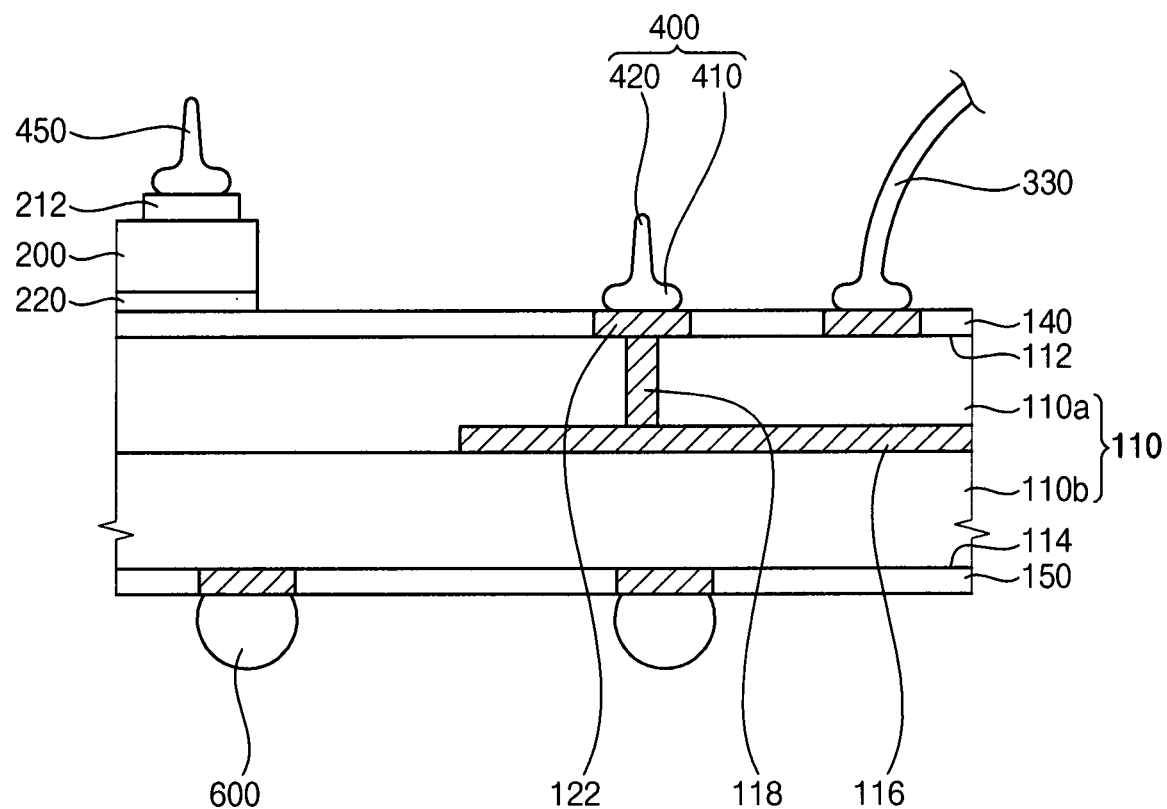
FIG. 19 is an enlarged cross-sectional view illustrating the "C" portion of FIG. 18.

FIG. 18 is a cross-sectional view illustrating a semiconductor package 102 according to an exemplary embodiment. FIG. 19 is an enlarged cross-sectional view illustrating the "C" portion of FIG. 18. The semiconductor package 102 may be substantially the same as or similar to the semiconductor package 100 described above with reference to FIG. 1 except for an additional electrostatic discharge structure 450. Thus, same reference numerals will be used to refer to the same or like elements and any further repetitive explanation concerning the above elements may be omitted.

Referring to FIGS. 18 and 19, a semiconductor package 102 may further include a second electrostatic discharge structure 450.

The second electrostatic discharge structure 450 may be arranged on at least one ground chip pad 212 exposed from an upper surface of a first semiconductor device 200. The ground chip pad 212 may be an input/output terminal serving as a ground pin on the upper surface of the first semiconductor device 200.

The ground chip pad 212 may be electrically connected to the package substrate 110. The ground chip pad 212 may be electrically connected to a substrate pad of a package substrate 110, for example, a ground substrate pad 122 by a first conductive connection member 230. The ground substrate pad 122 may be electrically connected to a ground plate 116 by a ground wiring 118. Accordingly, the second electrostatic discharge structure 450 may be grounded through the first conductive connection member 230, the ground substrate pad 122, and the ground plate 116.

Alternatively, the semiconductor package 102 may include only the second electrostatic discharge structure 450, and the first electrostatic discharge structure 400 may be omitted.

In a case where the first semiconductor device 200 is mounted on the package substrate 110 in a flip chip bonding manner, the ground chip pad 212 may be electrically connected to the ground plate 116 of the package substrate 110 through a conductive bump, for example, solder bump.

Hereinafter, a method of manufacturing the semiconductor package 102 in FIG. 14 will be explained.

Figure 20:
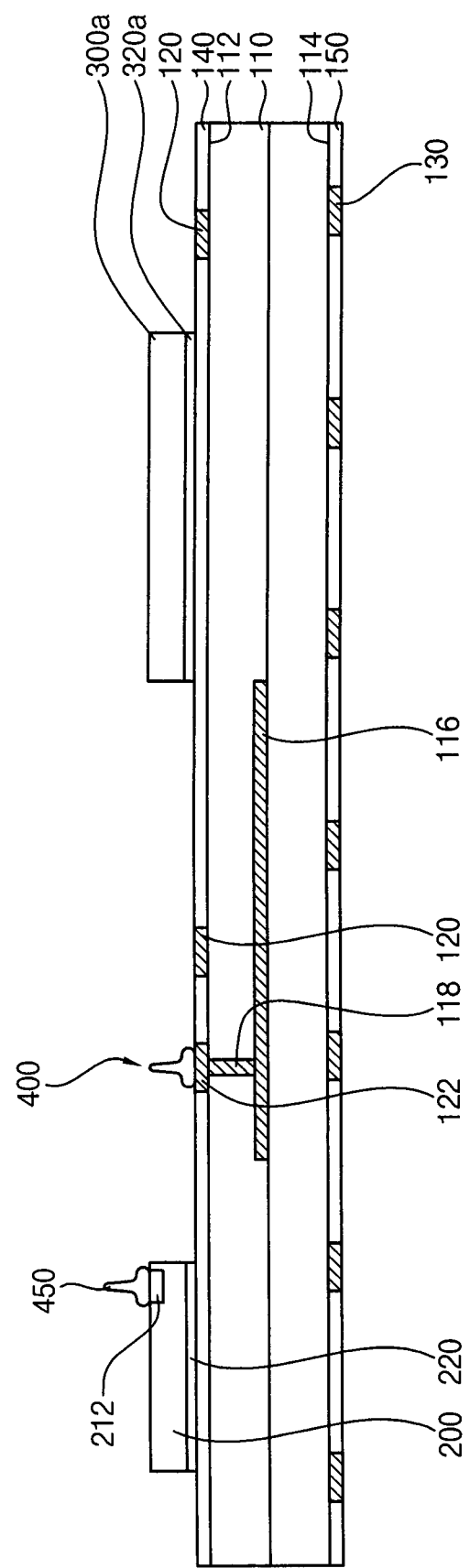
FIGS. 20 to 22 are cross-sectional views illustrating a method of manufacturing a semiconductor package according to one or more exemplary embodiments.
Figure 21:
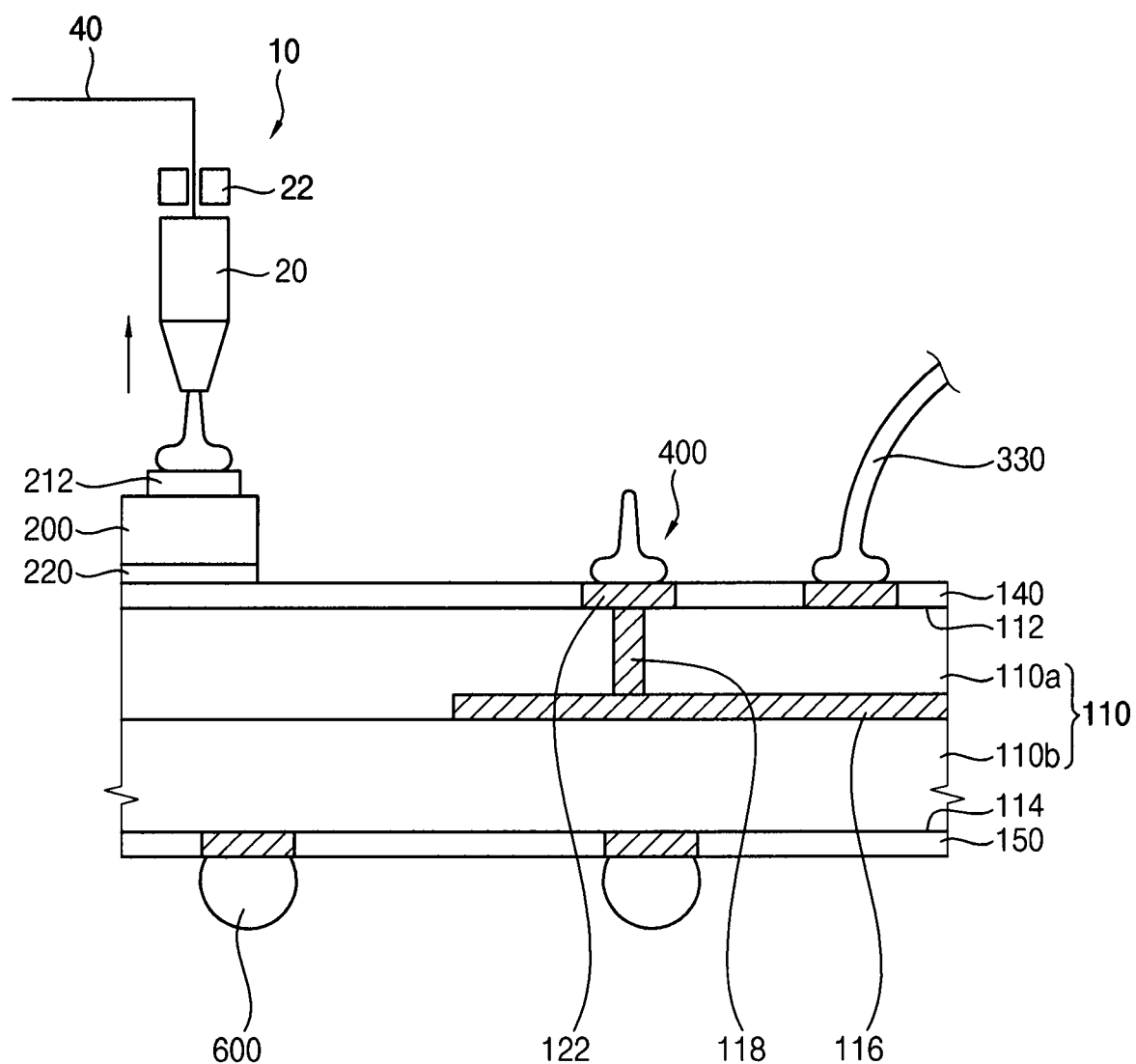
Figure 22:
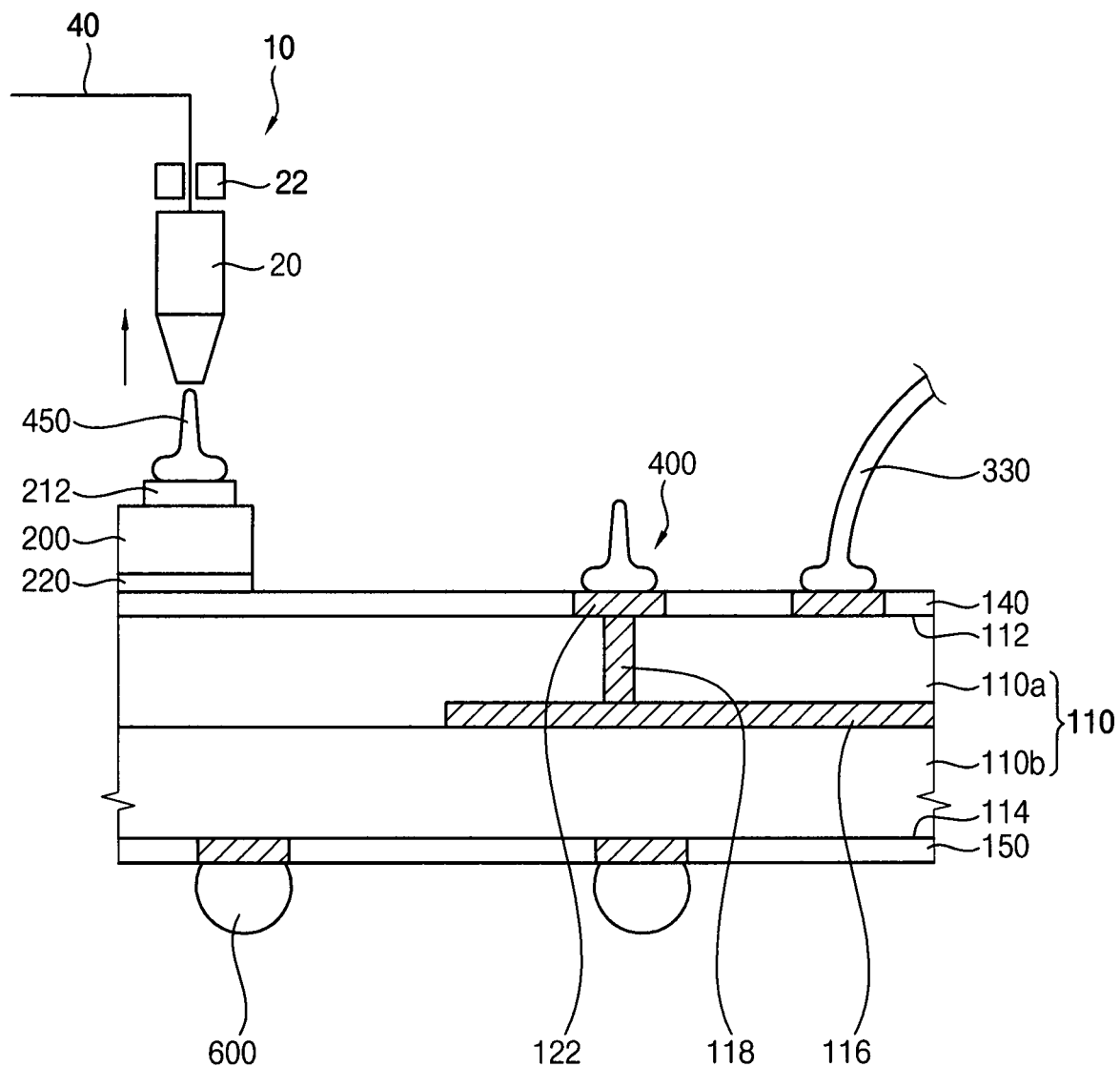

FIGS. 20 to 22 are cross-sectional views illustrating a method of manufacturing a semiconductor package 102 according to one or more exemplary embodiments.

Referring to FIGS. 20 to 22, first, processes similar to the processes described above with reference to FIGS. 4 and 5 may be performed to arrange a first semiconductor device 200 and at least one second semiconductor device 300 on a package substrate 110, a wire bonding process may be performed to electrically connect the first semiconductor device 200 to the package substrate 110, and an electrostatic discharge structure 400 may be formed on a ground substrate pad 122 and a second electrostatic discharge structure 450 may be formed on a ground chip pad 212 during the wiring bonding process.

Chip pads 210 and at least one ground chip pad 212 may be arranged on an upper surface of the first semiconductor device 200. The ground chip pad 212 may be an input/output terminal serving as a ground pin.

First, the wiring bonding process may be performed to connect the chips pads 210 of the first semiconductor device 200 to substrate pads 120 on an upper surface 112 of the package substrate 110. The chip pads 210 of the first semiconductor device 200 may be connected to the substrate pad 120 by first conductive connection members 230, for example, bonding wires.

Then, the electrostatic discharge structure 400 (first electrostatic discharge structure 400) may be formed on the ground substrate pad 122, and the second electrostatic discharge structure 450 may be formed on the ground chip pad 212. The method of forming the second electrostatic discharge structure 450 may be substantially the same as the method of forming the electrostatic discharge structure 400.

As illustrated in FIGS. 21 and 22, a capillary 20 of a wiring bonding apparatus 10 may move to the ground chip pad 212 to bond a wire 40 to the ground chip pad 212. A ball formed by a discharge torch may be compressed on the ground chip pad 212 such that a tip end of the wire 40 may be bonded to the ground chip pad 212. The capillary 20 may move upwardly to withdraw the wire 40 to a predetermined height and a clamp 22 may cut the wire 40, to form a wire bump 450 having a tip portion in an upper end portion. According to another exemplary embodiment, the second electrostatic discharge structure 450 may be formed to have an arch-shaped connection portion as described above with reference to FIGS. 14 and 15.

The wire bump-shaped second electrostatic discharge structure 450 may include a bonding portion bonded to the ground chip pad 212 and the tip portion extending to a predetermined height from the bonding portion. The tip portion may include a sharp top portion.

Accordingly, electrostatic charges generated when second semiconductor devices 300 are stacked on the package substrate 110 by a following die attach process may be discharged safely through the electrostatic discharge structure 400, the second electrostatic discharge structure 450 and ground paths in the package substrate 110.

Then, processes similar to the processes described above with reference to FIGS. 9 to 12 may be performed to stack a plurality of the second semiconductor devices 300 on the package substrate 110, and a wire bonding process may be performed to electrically connect the second semiconductor devices 300 to the package substrate 110.

Then, processes similar to the processes described above with reference to FIG. 13 may be performed to form a molding member 500 on the package substrate 110 to cover the first and second semiconductor devices 200, 300. The molding member 500 may include epoxy molding compound (EMC).

Outer connection members 600 may be formed on outer connection pads 130 on a lower surface 114 of the package substrate 110, to complete a semiconductor package 102.

An electronic device including a semiconductor package 100, 101, 102 in accordance with exemplary embodiments may include logic devices such as central processing units (CPUs), main processing units (MPUs), application processors (APs), or the like, and volatile memory devices such as DRAM devices, high bandwidth memory (HBM) devices, or non-volatile memory devices such as flash memory devices, phase-change random access memory (PRAM) devices, magnetoresistive random access memory (MRAM) devices, resistive random access memory (ReRAM) devices, or the like. The electronic device may be embodied by a personal computer (PC), a server device, a workstation, a processing device, or a portable electronic device such as a notebook, a cell phone, a personal digital assistant (PDA), a camera, etc.

While the die attach process is performed, highly electrostatic charges may be generated when an adhesive film peels off from an underlying based film. According to exemplary embodiments, the generated electrostatic charges may be discharged safely through the electrostatic discharge structure arranged adjacent to the first semiconductor device, to thereby prevent the first semiconductor device from being damaged by the electrostatic charges. Thus, product yield of the semiconductor package may be improved and productivity may be maximized.

The foregoing is illustrative of exemplary embodiments and is not to be construed as limiting thereof. Although a few exemplary embodiments have been described, those skilled in the art will readily appreciate that many modifications are possible without materially departing from the novel teachings and advantages of the present inventive concept. Accordingly, all such modifications are intended to be included within the scope of example embodiments as defined in the claims.

What is claimed is:

1. A method of manufacturing a semiconductor package, the method comprising:
arranging a first semiconductor device on a package substrate;
forming an electrostatic discharge structure above an upper surface of the package substrate and on a ground substrate pad exposed from the upper surface of the package substrate;
stacking a plurality of second semiconductor devices on the package substrate and spaced apart from the first semiconductor device, the electrostatic discharge structure being interposed between the first semiconductor device and the plurality of second semiconductor devices; and
forming a molding member on the package substrate to cover the first semiconductor device and the plurality of second semiconductor devices.

2. The method of claim 1, wherein the forming the electrostatic discharge structure is performed during a wiring bonding process for electrically connecting the first semiconductor device and the package substrate.

3. The method of claim 1, wherein the forming the electrostatic discharge structure comprises forming, on the ground substrate pad, a wire loop having an arch shape.

4. The method of claim 1, wherein the forming the electrostatic discharge structure is performed after at least one second semiconductor device of the plurality of second semiconductor devices is adhered to the package substrate.

5. The method of claim 1, wherein the ground substrate pad is grounded through a ground plate in the package substrate.

6. The method of claim 1, further comprising forming a second electrostatic discharge structure on at least one ground chip pad exposed from an upper surface of the first semiconductor device.

7. The method of claim 1, wherein the forming the electrostatic discharge structure comprises forming, on the ground substrate pad, a wire bump having a tip portion on an upper portion thereof.

8. The method of claim 7, wherein the forming the electrostatic discharge structure comprises:
bonding a wire to the ground substrate pad by a wire bonding apparatus; and
cutting the wire to have a predetermined height.

9. The method of claim 1, wherein the stacking the plurality of second semiconductor devices on the package substrate comprises adhering the plurality of second semiconductor devices using adhesive films.

10. The method of claim 9, further comprising performing a wire bonding process to electrically connect the plurality of second semiconductor devices to the package substrate.

11. A method of manufacturing a semiconductor package, the method comprising:
providing a package substrate having a ground substrate pad on an upper surface thereof;
arranging a first semiconductor device on the package substrate;
performing a wire bonding process to electrically connect the first semiconductor device to the package substrate;
forming an electrostatic discharge structure above the upper surface of the package substrate and on the ground substrate pad during the wire bonding process;

stacking a plurality of second semiconductor devices on the package substrate and spaced apart from the first semiconductor device, the electrostatic discharge structure being interposed between the first semiconductor device and the plurality of second semiconductor devices; and forming a molding member on the package substrate to cover the first semiconductor device and the plurality of second semiconductor devices.

12. The method of claim 11, wherein the forming the electrostatic discharge structure comprises forming, on the ground substrate pad, a wire loop having an arch shape.

13. The method of claim 11, wherein the forming the electrostatic discharge structure is performed after at least one second semiconductor device of the plurality of second semiconductor devices is adhered to the package substrate.

14. The method of claim 11, wherein the ground substrate pad is grounded through a ground plate in the package substrate.

15. The method of claim 11, further comprising forming a second electrostatic discharge structure on a ground chip pad of the first semiconductor device during the wire bonding process.

16. The method of claim 11, wherein the first semiconductor device comprises a logic chip, and the plurality of second semiconductor devices comprises a memory chip.

17. The method of claim 11, wherein the forming the electrostatic discharge structure comprises forming, on the ground substrate pad, a wire bump having a tip portion on an upper portion thereof.

18. The method of claim 17, wherein the forming the electrostatic discharge structure comprises:
bonding a wire to the ground substrate pad by a wire bonding apparatus; and
cutting the wire to have a predetermined height.

19. The method of claim 11, wherein the stacking the plurality of second semiconductor devices on the package substrate comprises adhering the plurality of second semiconductor devices using adhesive films.

20. The method of claim 19, further comprising performing a wire bonding process to electrically connect the plurality of second semiconductor devices to the package substrate.

* * * * *